(12) United States Patent
Shinya

(10) Patent No.: US 10,804,499 B2
(45) Date of Patent: Oct. 13, 2020

(54) LIGHT EMITTING ELEMENT, DISPLAY ELEMENT, AND METHOD FOR PRODUCING LIGHT EMITTING ELEMENT

(71) Applicant: Sony Semiconductor Solutions Corporation, Kanagawa (JP)

(72) Inventor: Kimihiro Shinya, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/320,750

(22) PCT Filed: May 31, 2017

(86) PCT No.: PCT/JP2017/020269
§ 371 (c)(1),
(2) Date: Jan. 25, 2019

(87) PCT Pub. No.: WO2018/034040
PCT Pub. Date: Feb. 22, 2018

(65) Prior Publication Data
US 2019/0165322 A1    May 30, 2019

(30) Foreign Application Priority Data
Aug. 19, 2016  (JP) .................... 2016-160960

(51) Int. Cl.
*H01L 51/52*    (2006.01)
*H01L 27/32*    (2006.01)
(Continued)

(52) U.S. Cl.
CPC ............ *H01L 51/5271* (2013.01); *G09F 9/30* (2013.01); *H01L 27/3244* (2013.01);
(Continued)

(58) Field of Classification Search
CPC ............ H01L 27/3244; H01L 27/3246; H01L 51/5253; H01L 51/5271; H01L 51/56; H01L 27/3283; H01L 27/3295
See application file for complete search history.

(56) References Cited

U.S. PATENT DOCUMENTS

| | | | | |
|---|---|---|---|---|
| 2015/0115251 A1* | 4/2015 | Jinta | ................... | H01L 27/3213 257/40 |
| 2015/0179719 A1* | 6/2015 | Nam | ................... | H01L 27/3246 257/40 |
| 2016/0126458 A1* | 5/2016 | Hiraoka | .................. | H01L 51/56 257/40 |

FOREIGN PATENT DOCUMENTS

| | | |
|---|---|---|
| JP | 2006-252839 A | 9/2006 |
| JP | 2014-096476 A | 5/2014 |

(Continued)

*Primary Examiner* — Joseph M Galvin, III
(74) *Attorney, Agent, or Firm* — Michael Best & Friedrich LLP

(57) ABSTRACT

[Object] To provide a light emitting element that enables efficient light extraction and offers low power consumption. [Solution] A light emitting element including: a lower electrode disposed on a support layer; first members disposed on the support layer so as to surround the lower electrode to form a recess structure, the first members each having a void inside; an organic layer disposed on the lower electrode and the first members and along the recess structure, the organic layer containing an organic luminescent material; an upper electrode disposed on the organic layer and along the recess structure; and a second member disposed above the upper electrode such that the recess structure is embedded in the second member, the second member having a higher refractive index than the first members.

20 Claims, 20 Drawing Sheets

(51) Int. Cl.
*G09F 9/30* (2006.01)
*H01L 51/56* (2006.01)

(52) U.S. Cl.
CPC ...... *H01L 27/3246* (2013.01); *H01L 51/5253* (2013.01); *H01L 51/56* (2013.01)

(56) References Cited

FOREIGN PATENT DOCUMENTS

| | | | |
|---|---|---|---|
| JP | 2014-220235 | A | 11/2014 |
| JP | 2015-088319 | A | 5/2015 |
| JP | 2016-085796 | A | 5/2016 |
| WO | 2014/188695 | A1 | 11/2014 |

* cited by examiner

LIGHT EMITTING ELEMENT, DISPLAY ELEMENT, AND METHOD FOR PRODUCING LIGHT EMITTING ELEMENT

TECHNICAL FIELD

The present disclosure relates to a light emitting element, a display element, and a method for producing a light emitting element.

BACKGROUND ART

In recent years, light emitting elements in which an organic layer containing an organic luminescent material is used as a light source (these light emitting elements are called organic light emitting diodes) have been developed. To improve brightness, such a light emitting element requires efficient light extraction from the light source.

For example, Patent Literature 1 described below discloses a light emitting module in which a protrusion inclined toward a lower electrode and a light-transmissive partition wall overlying the side wall of the protrusion are disposed at each end of a light emitting element including an organic layer containing a luminescent organic compound and sandwiched between the lower electrode and an upper electrode. According to the light emitting module disclosed in Patent Literature 1, the light emitted from the organic layer toward the sides can be reflected off the protrusions and directed toward the front of the light emitting module. This light emitting module enables efficient extraction of light emitted from the organic layer.

CITATION LIST

Patent Literature

Patent Literature 1: JP 2014-220235A

DISCLOSURE OF INVENTION

Technical Problem

However, in the light emitting module disclosed in Patent Literature 1, the protrusions that reflect the light emitted from the organic layer are made of the same metal as the lower electrode or the like. In the light emitting module disclosed in Patent Literature 1, the parasitic capacitance is thus generated between the lower electrode and the protrusions, which may cause unintended light emission at the ends of the light emitting element. In addition, a leakage current tends to be generated between the lower electrode and the protrusions, which increases the power consumption of the light emitting module.

In such circumstances, the present disclosure proposes a novel and improved light emitting element that enables efficient light extraction and offers low power consumption, a display element including the light emitting element, and a method for producing the light emitting element.

Solution to Problem

According to the present disclosure, there is provided a light emitting element including: a lower electrode disposed on a support layer; first members disposed on the support layer so as to surround the lower electrode to form a recess structure, the first members each having a void inside; an organic layer disposed on the lower electrode and the first members and along the recess structure, the organic layer containing an organic luminescent material; an upper electrode disposed on the organic layer and along the recess structure; and a second member disposed above the upper electrode such that the recess structure is embedded in the second member, the second member having a higher refractive index than the first members.

In addition, according to the present disclosure, there is provided a display element including a plurality of light emitting elements arranged on a plane, each of the light emitting elements including a lower electrode disposed on a support layer, first members disposed on the support layer so as to surround the lower electrode to form a recess structure, the first members each having a void inside, an organic layer disposed on the lower electrode and the first members and along the recess structure, the organic layer containing a luminescent organic compound, an upper electrode disposed on the organic layer and along the recess structure, and a second member disposed above the upper electrode such that the recess structure is embedded in the second member, the second member having a higher refractive index than the first members.

In addition, according to the present disclosure, there is provided a method for producing a light emitting element, the method including: forming a lower electrode on a support layer; forming first members positioned to surround the lower electrode on the support layer so as to form a recess structure having the lower electrode as a bottom surface, the first members each having a void inside; forming an organic layer on the lower electrode and the first members and along the recess structure, the organic layer containing an organic luminescent material; forming an upper electrode on the organic layer and along the recess structure; and forming a second member above the upper electrode such that the recess structure is embedded in the second member, the second member having a higher refractive index than the first members.

According to the present disclosure, the formation of a void in the first member that surrounds the lower electrode to form the recess structure enables light emitted from the organic layer to be reflected in a light reflection part including the second member and the first member and in a light reflection part including the first member and the void. In addition, since the void has a very low permittivity, the void can reduce the parasitic capacitance and prevent or reduce generation of leakage current between adjacent lower electrodes.

Advantageous Effects of Invention

According to the present disclosure, as described above, there is provided a light emitting element that enables efficient light extraction and offers low power consumption.

Note that the effects described above are not necessarily limitative. With or in the place of the above effects, there may be achieved any one of the effects described in this specification or other effects that may be grasped from this specification.

Figure 1:
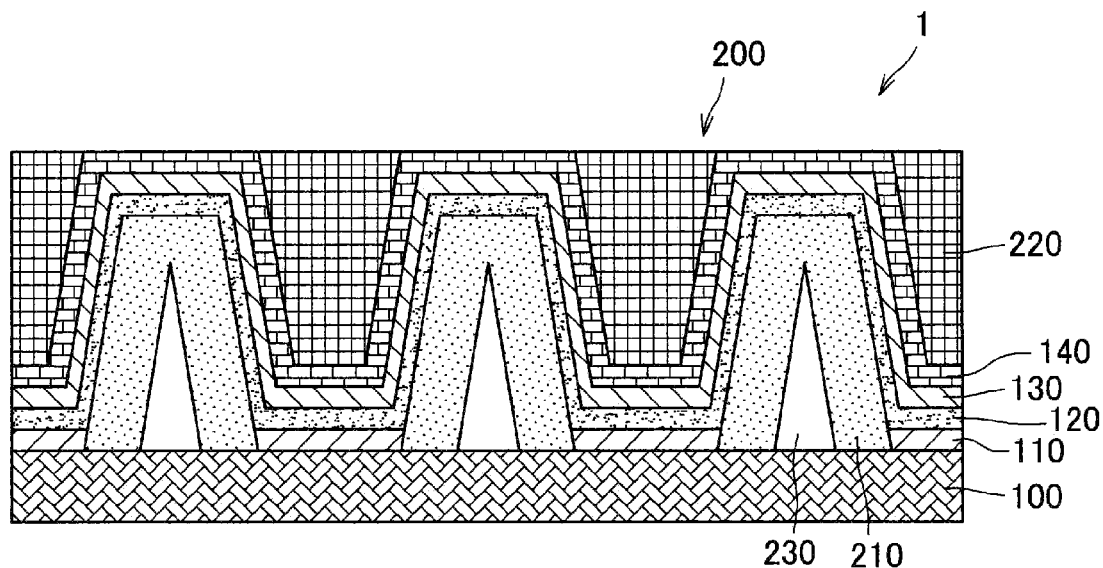
FIG. 1 is a cross-sectional view of an example of a light emitting element according to a first embodiment of the present disclosure cut in the stacking direction.

MODES FOR CARRYING OUT THE
INVENTION

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be given in the following order.
1. First Embodiment
1.1. Structure of Light Emitting Element
1.2. Modification
1.3. Method for Producing Light Emitting Element
2. Second Embodiment
2.1. Structure of Light Emitting Element
2.2. Method for Producing Light Emitting Element
3. Third Embodiment
3.1. Structure of Light Emitting Element
3.2. Method for Producing Light Emitting Element
4. Fourth Embodiment
4.1. Structure of Light Emitting Element
4.2. Method for Producing Light Emitting Element
5. Fifth Embodiment
5.1. Structure of Light Emitting Element
5.2. Method for Producing Light Emitting Element
6. Application Examples
7. Conclusion

1. FIRST EMBODIMENT (1.1. Structure of Light Emitting Element)

Figure 2:
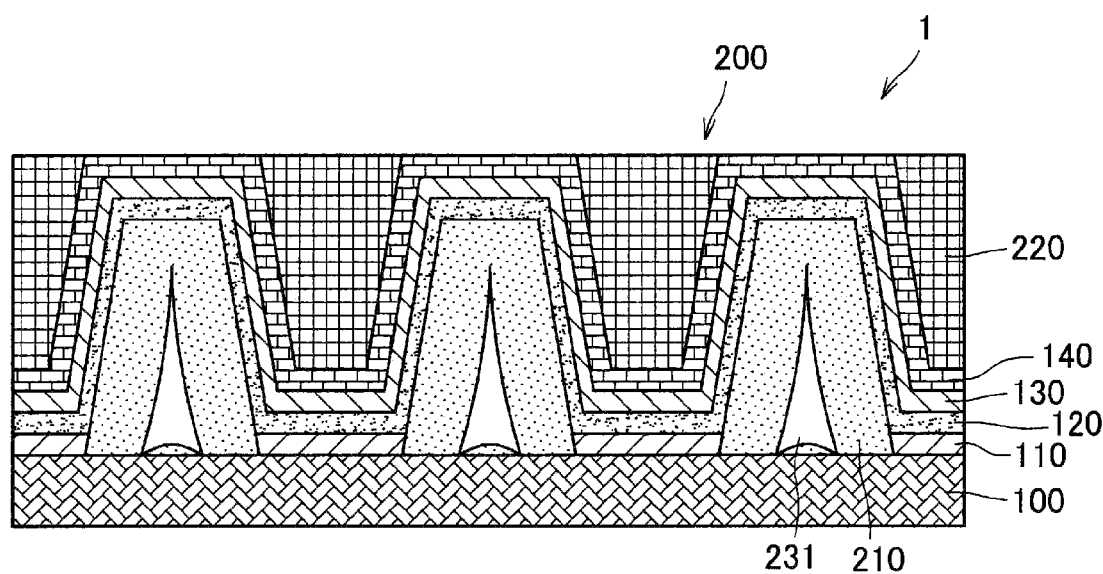
FIG. 2 is a cross-sectional view of another example of the light emitting element according to the first embodiment of the present disclosure cut in the stacking direction.

First, referring to FIG. 1 and FIG. 2, the structure of a light emitting element according to a first embodiment of the present disclosure will be described. FIG. 1 and FIG. 2 are cross-sectional views of the light emitting element according to this embodiment cut in the stacking direction.

For example, a plurality of the light emitting elements according to this embodiment arranged on a plane is used as a display element. Specifically, a plurality of the light emitting elements may be arranged as pixels on, for example, a substrate made of glass, semiconductor, resin, or the like to form a display element capable of displaying images and the like. In this case, a driver circuit configured to control light emission of each light emitting element, a power supply configured to supply electric power to be applied to the light emitting element, and the like are disposed on the substrate. In the technique according to the present disclosure, the driver circuit, the power supply, and the like may have any structure. Thus, the structures of the driver circuit, the power supply, and the like are not illustrated below.

As illustrated in FIG. 1, a light emitting element 1 includes a support layer 100, a lower electrode 110 disposed on the support layer 100, an organic layer 120 disposed on the lower electrode 110, an upper electrode 130 disposed on the organic layer 120, a protective layer 140 disposed on the upper electrode 130, first members 210 that form a recess structure having a lower electrode 110 as a bottom surface, a second member 220 in which the recess structure is embedded, and a void 230 formed inside each first member 210.

In the light emitting element 1, the organic layer 120 is sandwiched between the lower electrode 110 and the upper electrode 130 to form an organic light emitting diode (OLED), which functions as a light source.

Here, the organic light emitting diode that functions as a light source is disposed inside a recess structure 200 having the lower electrode 110, which serves as a bottom surface, and the first members 210, which serve as side walls. In addition, the recess structure 200 is embedded in the second member 220 having a higher refractive index than the first members 210. This configuration allows the first members 210 and the second member 220 to function as light reflection parts using a difference in refractive index. The first members 210 and the second member 220 thus reflect light emitted from the organic light emitting diode to improve light extraction efficiency.

The support layer 100 is a layer that supports the light emitting element 1. The support layer 100 may be, for example, an interlayer insulating film disposed on a driver circuit or the like (not illustrated) configured to control light emission of the light emitting element 1, or may be a planarization film disposed to cover steps or protrusions and recesses due to a driver circuit or the like and thus to planarize the surface. In addition, the support layer 100 may be any type of substrate commonly used in display devices or the like.

For example, the support layer 100 may be made of an inorganic insulating material, such as silicon oxide ($SiO_x$), silicon nitride ($SiN_x$), or silicon oxynitride (SiON), or may be made of an organic insulating material, such as a polyimide resin, an acrylic resin, or a novolak resin. In addition, the support layer 100 may be, for example, a substrate made of a type of glass, such as quartz glass, a type of semiconductor, such as silicon, or a type of resin.

The lower electrode 110 functions as an anode of the organic light emitting diode and is disposed at the bottom of the recess structure 200 having the first members 210 as side walls. Specifically, the lower electrode 110 may be formed as a light reflective electrode made of a metal, such as aluminum (Al), copper (Cu), platinum (Pt), gold (Au), chromium (Cr), or tungsten (W), or an alloy of these metals.

In addition, the lower electrode 110 may be formed as a transparent electrode made of a transparent conductive material, such as indium oxide zinc. Note that, in the case where the lower electrode 110 is a transparent electrode, a light reflective layer made of a metal, such as Al, Ag, Pt, Au, Cr, or W, is formed between the lower electrode 110 and the support layer 100.

The organic layer 120 is a layer that contains an organic luminescent material and emits light upon application of an electric field. The organic layer 120 is located between the lower electrode 110 and the upper electrode 130. Specifically, application of an electric field to the organic layer 120 causes injection of holes from the lower electrode 110 into the organic layer 120 and injection of electrons from the upper electrode 130 into the organic layer 120. The recombination of the injected holes and electrons in the organic layer 120 forms excitons. The energy of the excitons excites the organic luminescent material to cause emission of fluorescence or phosphorescence from the organic luminescent material.

For example, the organic layer 120 may contain at least one of a hole transport material, an electron transport material, or a hole and electron transport material, which is a host material; and a fluorescent or phosphorescent organic luminescent material, which is a dopant material.

Examples of the host material include styryl derivatives, anthracene derivatives, naphthacene derivatives, carbazole derivatives, aromatic amine derivatives, phenanthroline derivatives, triazole derivatives, quinolinolato metal complexes, and phenanthroline derivatives.

The dopant material (organic luminescent material) may be a known fluorescent material or phosphorescent material. Examples of known fluorescent materials include dye materials, such as styrylbenzene dyes, oxazole dyes, perylene dyes, coumarin dyes, and acridine dyes; polycyclic aromatic hydrocarbon materials, such as anthracene derivatives, naphthacene derivatives, pentacene derivatives, and chrysene derivatives; and pyrromethene skeleton materials, quinacridone derivatives, cyanomethylene pyran derivatives, benzothiazole derivatives, benzimidazole derivatives, and metal-chelated oxynoid compounds. Examples of known phosphorescent materials include organometallic complexes containing at least one metal selected from ruthenium, rhodium, palladium, silver, rhenium, osmium, iridium, platinum, and gold. Specific examples of phosphorescent materials include complexes such as Ir(ppy)$_3$, complexes such as Ir(bt)$_2$ acac$_3$, and complexes such as PtOEt$_3$, which have a precious metal element, such as Ir, as a central metal.

In addition, the organic layer 120 may have a multilayer structure formed by stacking a plurality of functional layers. For example, the organic layer 120 may have a structure in which a hole injection layer, a hole transport layer, a light emitting layer containing an organic luminescent material, an electron transport layer, and an electron injection layer are stacked in this sequence from the lower electrode 110 side.

The hole injection layer and the hole transport layer are layers that contain a hole transport material and improve the efficiency of injecting holes from the lower electrode 110. Examples of the hole transport material include benzine, styrylamine, triphenylamine, porphyrin, triphenylene, azatriphenylene, tetracyanoquinodimethane, triazole, imidazole, oxadiazole, polyarylalkanes, phenylenediamine, arylamines, oxazole, anthracene, fluorenone, hydrazone, stilbene, and derivatives thereof. Specific examples of the hole transport material include α-naphthylphenylphenylenediamine (α-NPD), porphyrin, metal tetraphenylporphyrin, metal naphthalocyanine, hexacyanoazatriphenylene (HAT), 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methylphenylphenylamino)triphenylamine, N,N,N',N'-tetrakis(p-tolyl)p-phenylenediamine, N,N,N', N'-tetraphenyl-4,4'-diaminobiphenyl, N-phenylcarbazole, and 4-di-p-tolylamino stilbene.

The electron transport layer is a layer that contains an electron transport material and improves the efficiency of injecting electrons from the upper electrode 130. Examples of the electron transport material include tris(8-quinolinolato)aluminum (Alq$_3$), and compounds having a nitrogen-containing aromatic ring. Specific examples of the electron transport material include tris(8-quinolinolato)aluminum (Alq$_3$), 2,9-dimethyl-4,7-diphenyl-1,10-phenanthroline (BCP), and bathophenanthroline (Bphen). Here, the electron transport layer may include a plurality of layers. In this case, the electron transport layer may further include a layer doped with an alkali metal element or an alkaline earth metal element.

The electron injection layer is a layer that improves the efficiency of injecting electrons from the upper electrode 130. The electron injection layer may be made of, for example, lithium fluoride (LiF), sodium chloride (NaCl), cesium fluoride (CsF), lithium oxide (Li$_2$O), or barium oxide (BaO).

The upper electrode 130 functions as a cathode of the organic light emitting diode and is disposed on the organic layer 120. Specifically, the upper electrode 130 may be made of a light transmissive material having a small work function and formed as a transparent electrode. The upper electrode 130 may be made of, for example, a transparent conductive material, such as indium tin oxide or indium zinc oxide, or may be made of magnesium (Mg), silver (Ag), or an alloy thereof and formed as a film that is thin enough (e.g., 30 nm or less) to allow light penetration.

The protective layer 140 is formed on the upper electrode 130 and avoids penetration of oxygen and water into the organic layer 120. The protective layer 140 may be made of, for example, a highly light transmissive material having low water permeability. For example, the protective layer 140 may be made of silicon oxide (SiO$_x$), silicon nitride (SiN$_x$), aluminum oxide (AlO$_x$), titanium oxide (TiO$_x$), or a combination thereof.

In addition, the protective layer 140 may have a multilayer structure in which a layer made of SiN$_x$ and a stacking film made of AlO$_x$ and TiO$_x$ are stacked in this order from the upper electrode 130 side. To enhance the reflection by the first members 210 and the second member 220, it is desirable to increase the refractive index of a surface of the protective layer 140 in contact with the second member 220. For this, the protective layer 140 preferably has the stacking film, which contains TiO$_x$ having a refractive index as high as 2.4 or more, on the surface in contact with the second member 220.

The first member 210 is formed on the support layer 100 and divides the organic light emitting diode into each pixel. The first member 210 has, for example, an inclined portion and has a substantially trapezoid shape (i.e., tapered shape) that widens toward the support layer 100. In other words, the recess structure 200 having the first members 210 as side walls has a shape that widens toward the side facing away from the support layer 100 (i.e., inverse tapered shape). The first members 210 are made of a highly light transmissive material having a lower refractive index than the second member 220. The first members 210 may be made of, for example, an organic insulating material, such as a polyimide resin, an acrylic resin, or a novolac resin, or an inorganic insulating material, such as silicon oxide (SiO$_x$), silicon nitride (SiN$_x$), or silicon oxynitride (SiON).

In addition, the first members 210 each have a void 230 inside. The void 230 is formed so as to have a tapered shape whose cross section when each first member 210 is cut in the thickness direction has a tapered shape that widens toward the support layer 100. The void 230 is formed so as to have, for example, a substantially triangular shape. Since the void 230 is a substantial vacuum, the void 230 has a refractive index of about 1, which is lower than that of the first member 210. Therefore, the void 230 functions as a light reflection part such that light reflects off the interface between the void 230 and the first member 210. The void 230 causes light emitted from the organic light emitting diode to reflect toward the opening of the recess structure 200. This can improve the light extraction efficiency of the light emitting element 1.

In addition, the void 230 has a very low permittivity because the void 230 is a substantial vacuum. For this, the void 230 can reduce the average of the permittivity between each of the lower electrodes 110 of the organic light emitting diode to reduce the parasitic capacitance generated between each of the lower electrodes 110. Furthermore, since the void 230 has a very low permittivity, the void 230 can block the electric field generated between each of the lower electrodes 110 of the organic light emitting diode. According to this configuration, the void 230 can prevent or reduce generation of leakage current between each of the lower electrodes 110 of the organic light emitting diode.

Therefore, in the light emitting element 1 according to this embodiment, the void 230 formed inside each first member 210 can reduce parasitic capacitance and leakage current while improving the light extraction efficiency, which makes it possible to further reduce power consumption.

Note that the lines connecting each of the vertices of the cross section of the void 230 when each first member 210 is cut in the thickness direction are not necessarily straight lines. For example, as illustrated in FIG. 2, the lines connecting each of the vertices of the cross section of the void 231 may be curved lines. In other words, in this embodiment, the expression the cross section of the void 230 has a "substantially triangular shape" means that the cross section of the void 230 has three vertices projecting outward, and the lines connecting each of the vertices may be either straight lines or curved lines.

The second member 220 is formed on the protective layer 140 such that the recess structure 200 formed by the first members 210 is embedded in the second member 220. The second member 220 is made of a highly light transmissive material having a higher refractive index than the first members 210. The second member 220 may be made of, for example, an organic insulating material, such as an acrylic resin, an epoxy resin, a polyester resin, or a novolac resin, or an inorganic insulating material, such as silicon oxide ($SiO_x$), silicon nitride ($SiN_x$), or silicon oxynitride (SiON).

Here, to increase the refractive index of the second member 220, the second member 220 may be made of, for example, a resin containing many substituents having high molecular refraction, such as sulfur-containing substituents, phosphorus-containing substituents, or aromatic rings, in the molecular structure, or the second member 220 may contain an inorganic filler having a high refractive index, such as $TiO_x$ or $ZrO_x$.

In the light emitting element 1 according to this embodiment, for example, the first members 210 may be made of a material having a refractive index of 1.1 or more and 1.8 or less, and the second member 220 may be made of a material having a refractive index that is larger than that of the first members 210 by 0.2 or more. In this case, the conditions for the total reflection of incident light can be satisfied between the first member 210 and the void 230 and between the second member 220 and the first member 210. Therefore, the light emitting element 1 enables the light emitted from the organic light emitting diode toward the side walls of the recess structure 200 to be efficiently reflected toward the opening of the recess structure 200.

Examples of the material of the first member 210 that satisfies such conditions include $SiO_x$. Examples of the material of the second member 220 include an acrylic resin containing a filler including $TiO_x$ or $ZrO_x$.

As described above, the light emitting element 1 according to this embodiment enables the light emitted from the organic light emitting diode toward the side walls of the recess structure 200 to be efficiently reflected toward the opening of the recess structure 200, which improves light extraction efficiency.

Note that the light emitting element 1 according to this embodiment may include, above the second member 220, for example, a counter substrate or a protective layer for protecting the light emitting element 1, and a black matrix or a color filter for improving the function of the light emitting element 1 for use as a display element.

(1.2. Modifications)

Figure 3:
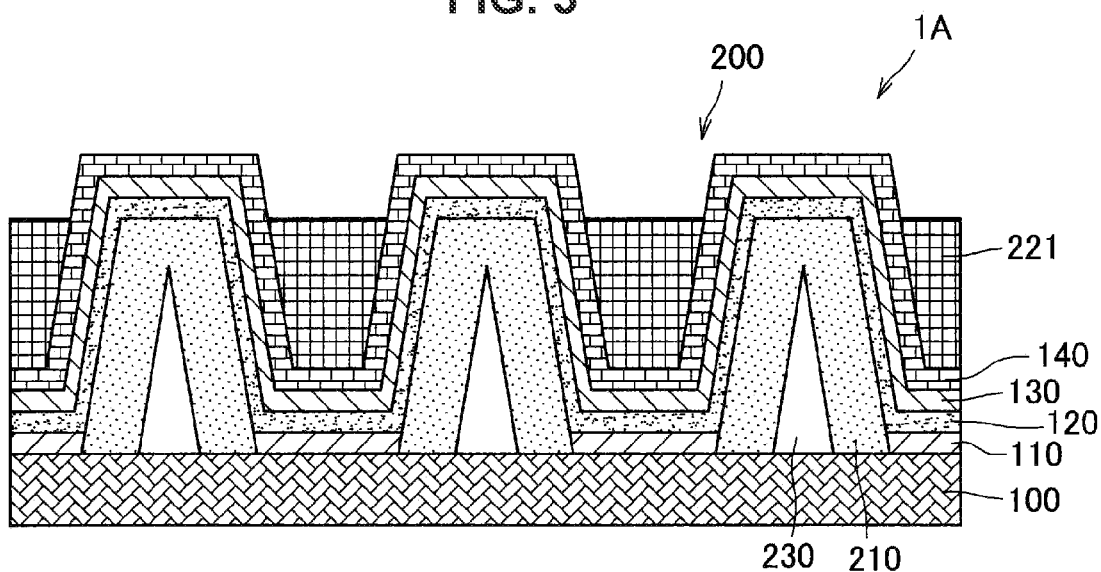
FIG. 3 is a cross-sectional view of a light emitting element according to a first modification of the embodiment cut in the stacking direction.
Figure 4:
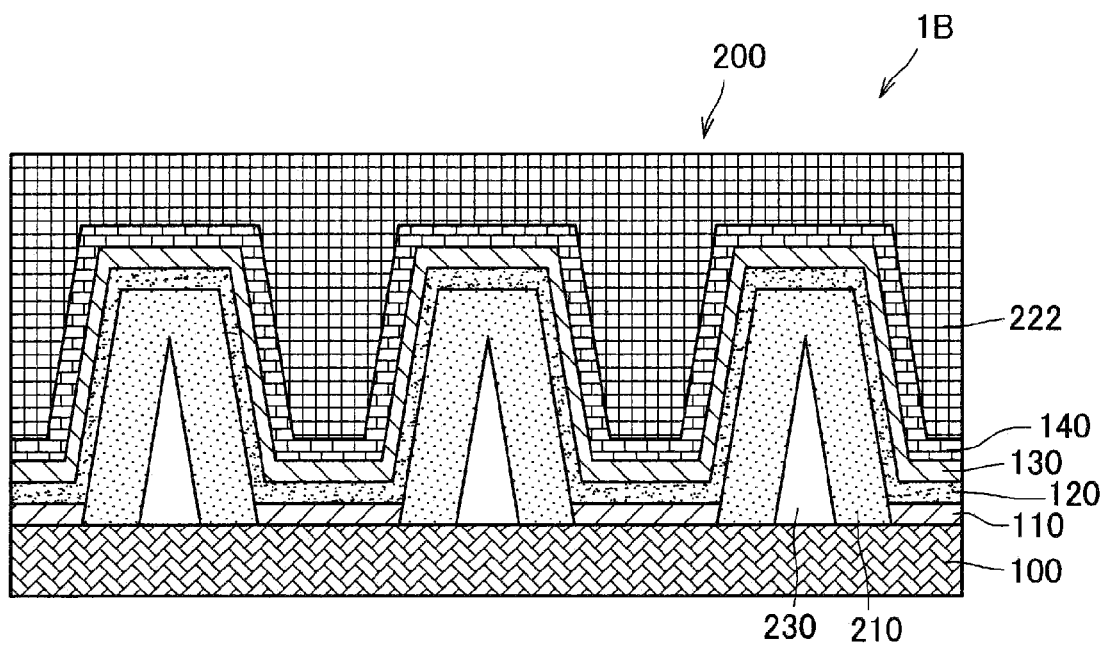
FIG. 4 is a cross-sectional view of a light emitting element according to a second modification of the embodiment cut in the stacking direction.

Next, referring to FIG. 3 and FIG. 4, the modifications of the light emitting element according to this embodiment will be described. FIG. 3 is a cross-sectional view of a light emitting element 1A according to a first modification of this embodiment cut in the stacking direction. FIG. 4 is a cross-sectional view of a light emitting element 1B according to a second modification of this embodiment cut in the stacking direction.

As illustrated in FIG. 3, the light emitting element 1A according to the first modification differs from the light emitting element 1 illustrated in FIG. 1 in that the recess structure 200 is not completely embedded in a second member 221. The elements other than the second member 221 are as described with reference to FIG. 1, and the description thereof is omitted here.

The light emitting element 1A according to the first modification may further include a color filter or the like inside the recess structure 200 and on the second member 221. This structure is also called a color filter-embedded structure. In the light emitting element 1A according to the first modification, a color filter or the like can be disposed only above the organic light emitting diode without disposing a color filter or the like above the top of the first members 210. This configuration can improve color separation in each pixel.

As illustrated in FIG. 4, the light emitting element 1B according to the second modification differs from the light emitting element 1 illustrated in FIG. 1 not only in that the recess structure 200 is embedded in a second member 222 but also in that the second member 222 is further deposited on the top of the first members 210. The elements other than the second member 222 are as described with reference to FIG. 1, and the description thereof is omitted here.

In the light emitting element 1B according to the second modification, the second member 222 has a large thickness. The first members 210 and the second member 222 thus enable reflection of a large amount of light. Therefore, in the light emitting element 1B according to the second modification, the light emitted from the organic light emitting diode can be collected on the opening side of the recess structure 200, whereby light extraction efficiency can be improved to realize high brightness with the same power consumption.

(1.3. Method for Producing Light Emitting Element)

Next, referring to FIG. 5 to FIG. 13, a method for producing the light emitting element 1 according to this embodiment will be described. FIG. 5 to FIG. 13 are cross-sectional views illustrating the steps of the method for producing the light emitting element 1 according to this embodiment.

Figure 5:
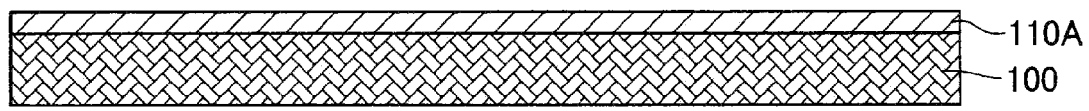
FIG. 5 is a cross-sectional view illustrating a step of a method for producing a light emitting element according to the embodiment.

First, as illustrated in FIG. 5, a metal layer 110A is deposited on a support layer 100 by using a sputtering method or the like. The support layer 100 may be a substrate made of glass, semiconductor, or resin, or may be an interlayer insulating film made of an inorganic insulating material, such as $SiO_x$, $SiN_x$, or SiON and disposed on a driver circuit or the like. In addition, the metal layer 110A may be made of, for example, an AlCu alloy.

Figure 6:
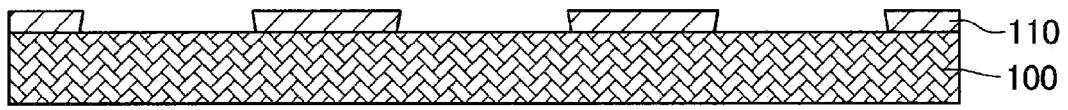
FIG. 6 is a cross-sectional view illustrating a step of a method for producing a light emitting element according to the embodiment.

Next, as illustrated in FIG. 6, the metal layer 110A is patterned by using a photolithography method or the like to form lower electrodes 110.

Figure 7:
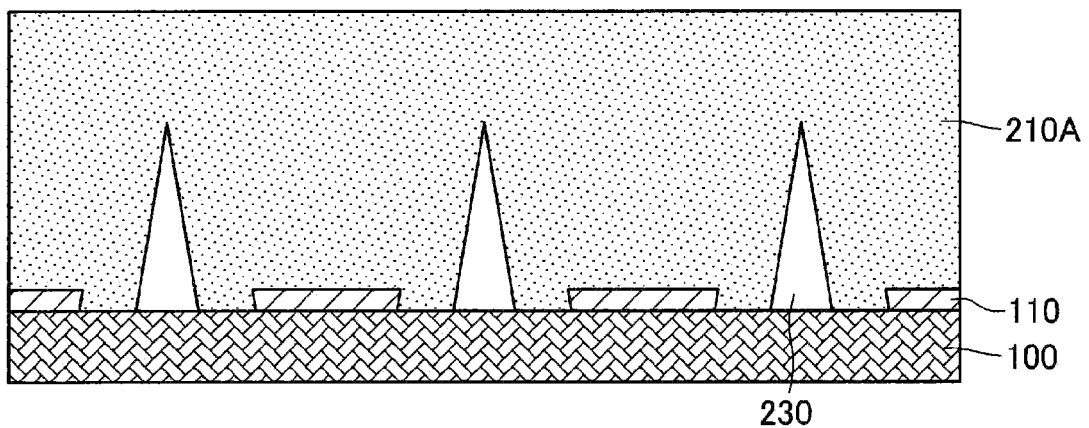
FIG. 7 is a cross-sectional view illustrating a step of a method for producing a light emitting element according to the embodiment.

Subsequently, as illustrated in FIG. 7, a first member layer 210A is deposited on the metal layer 110A by using a chemical vapor deposition (CVD) method or the like. The first member layer 210A may be made of, for example, an inorganic insulating material, such as $SiO_x$.

At this time, the voids 230 can be formed between adjacent lower electrodes 110 by more isotropically depositing the first member layer 210A by using a CVD method in a low-vacuum chamber.

For example, in the case where a plurality of lower electrodes 110 are provided on the support layer 100, a source gas of CVD is unlikely to travel into the spaces between the lower electrodes 110, which results in a lower rate of deposition in the spaces between the lower electrodes 110 than that on the lower electrodes 110. In particular, in the case where the pressure in the chamber is relatively high and the mean free path of the source gas particles is short, the rate of deposition in the spaces between the lower electrodes 110 is low. The coverage with the first member layer 210A deposited on each of the lower electrodes 110 is performed before deposition of the first member layer 210A in the spaces between the lower electrodes 110, whereby the voids 230 can be formed between the lower electrodes 110.

Note that, to facilitate formation of the voids 230, it is desired to hinder the travel of the source gas of CVD into the spaces between the lower electrodes 110. Specifically, the distance between the lower electrodes 110 may be shortened, or the height of the lower electrodes 110 may be increased.

Figure 8:
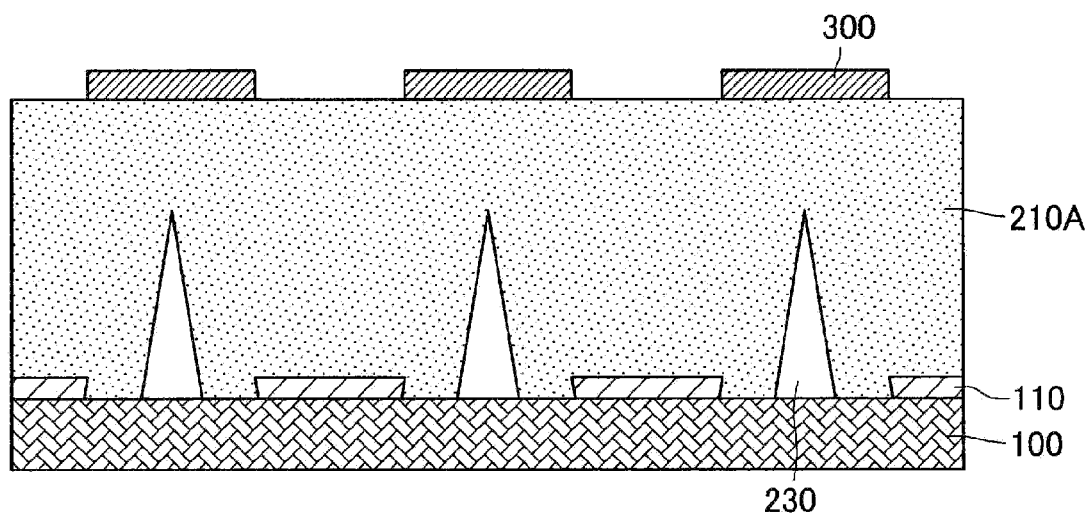
FIG. 8 is a cross-sectional view illustrating a step of a method for producing a light emitting element according to the embodiment.

Next, as illustrated in FIG. 8, a patterned resist 300 is formed on the first member layer 210A by using a photolithography method or the like. The resist 300 may be any known resist as long as the etching selectivity ratio between the resist 300 and $SiO_x$ forming the first member layer 210A is high. Furthermore, an anti-reflection film, which is also called a bottom anti-reflection coating (BARC) film, is preferably formed between the resist 300 and the first member layer 210A. The use of the BARC film can prevent or reduce halation during photolithography and can thus improve the patterning accuracy of the resist 300.

Figure 9:
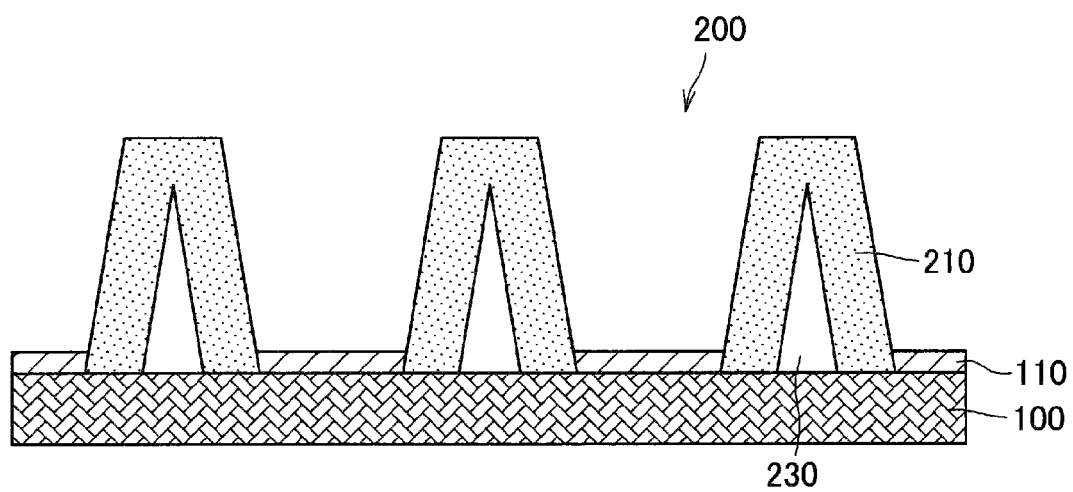
FIG. 9 is a cross-sectional view illustrating a step of a method for producing a light emitting element according to the embodiment.

Subsequently, as illustrated in FIG. 9, the lower electrodes 110 are exposed by performing etching using the patterned resist 300 as a mask, whereby first members 210 that form the recess structure 200 is formed. For example, in the case where the first members 210 are made of $SiO_x$, the first members 211 can be formed by using dry etching with a fluorocarbon gas.

Figure 10:
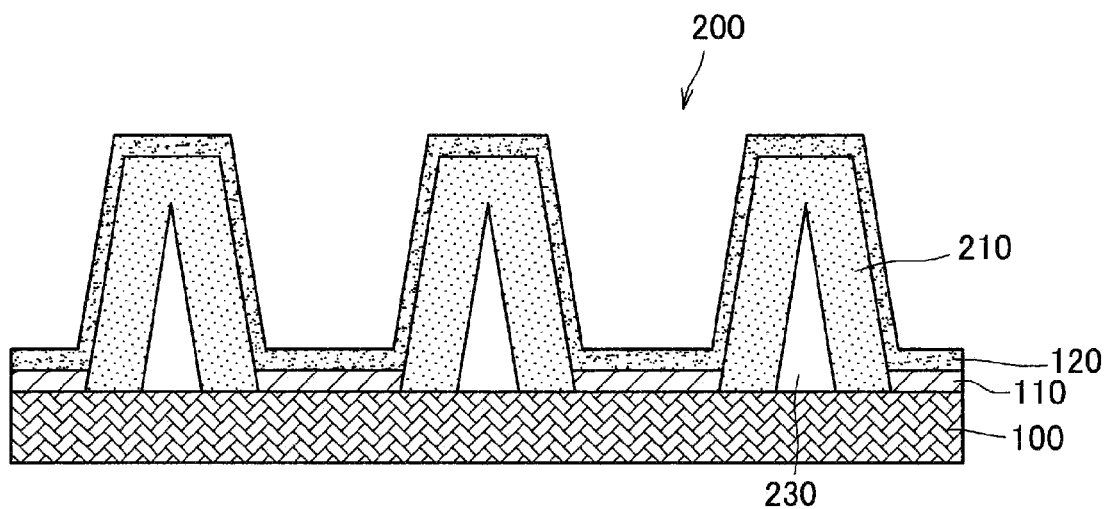
FIG. 10 is a cross-sectional view illustrating a step of a method for producing a light emitting element according to the embodiment.

Next, as illustrated in FIG. 10, an organic layer 120 containing the organic luminescent material described above is formed on the lower electrodes 110 and the first members 210 and along the recess structure 200 by using a vacuum vapor deposition method or the like. At this time, vapor deposition is preferably directional in the direction perpendicular to the support layer 100 so that the organic layer 120 is also uniformly deposited inside the recess structure 200. In addition, the organic layer 120 may be formed by vapor-depositing two or more layers for each function in sequence.

Figure 11:
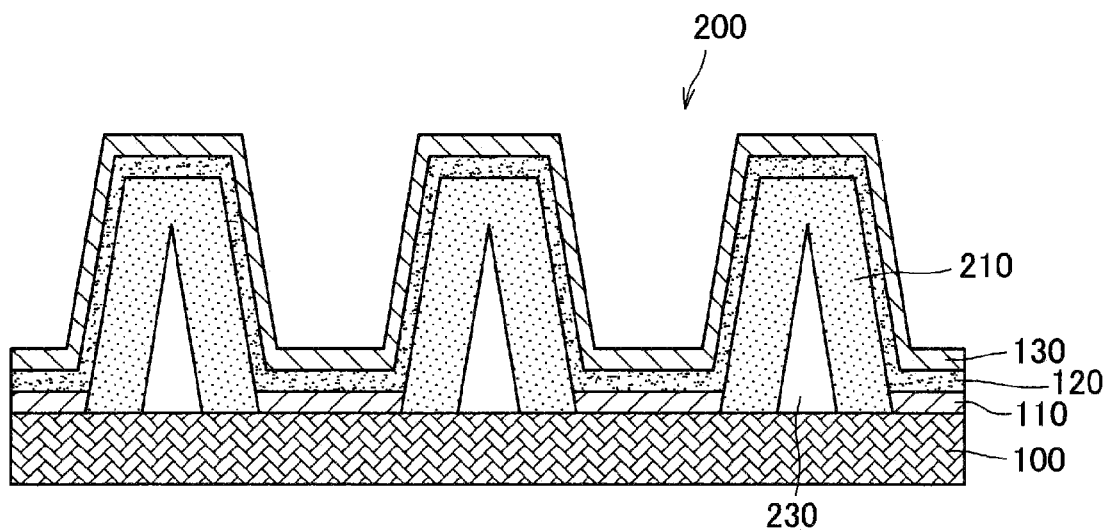
FIG. 11 is a cross-sectional view illustrating a step of a method for producing a light emitting element according to the embodiment.

Subsequently, as illustrated in FIG. 11, an upper electrode 130 is deposited on the organic layer 120 and along the recess structure 200 by using a sputtering method or the like. For example, the upper electrode 130 may be made of indium zinc oxide.

Figure 12:
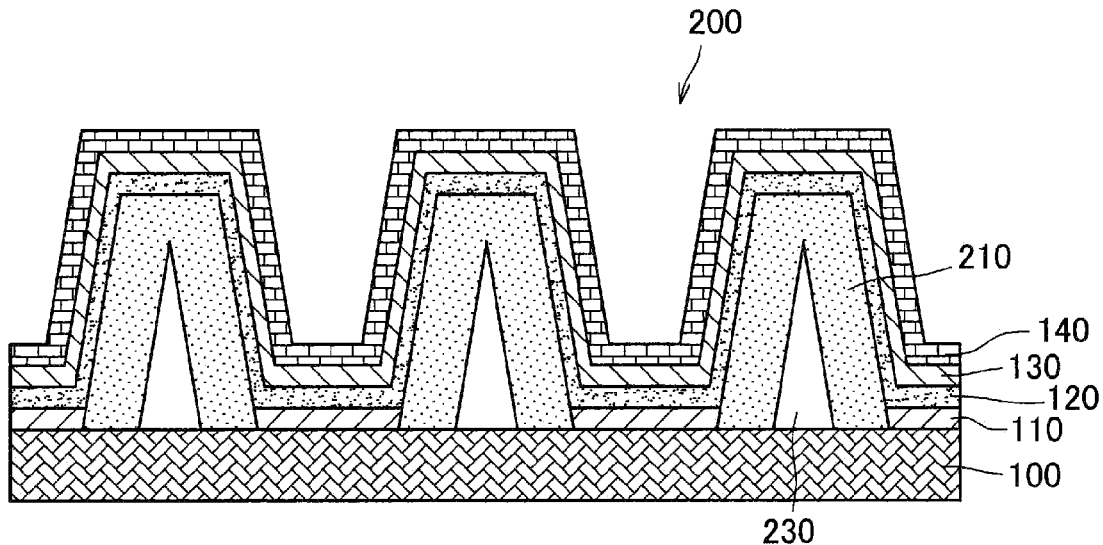
FIG. 12 is a cross-sectional view illustrating a step of a method for producing a light emitting element according to the embodiment.

Next, as illustrated in FIG. 12, a protective layer 140 is formed on the upper electrode 130 and along the recess structure 200. Specifically, first, a $SiN_x$ film is deposited on the upper electrode 130 by using a CVD method. Here, the $SiN_x$ film may be deposited at a relatively low density in order to reduce the film stress. Thereafter, a stacking film having a high refractive index and made of $AlO_x$ and $TiO_x$ is deposited on the $SiN_x$ film by using an atomic layer deposition (ALD) method. Accordingly, the protective layer 140 including the $SiN_x$ film and the stacking film made of $AlO_x$ and $TiO_x$ can be formed on the upper electrode 130.

Figure 13:
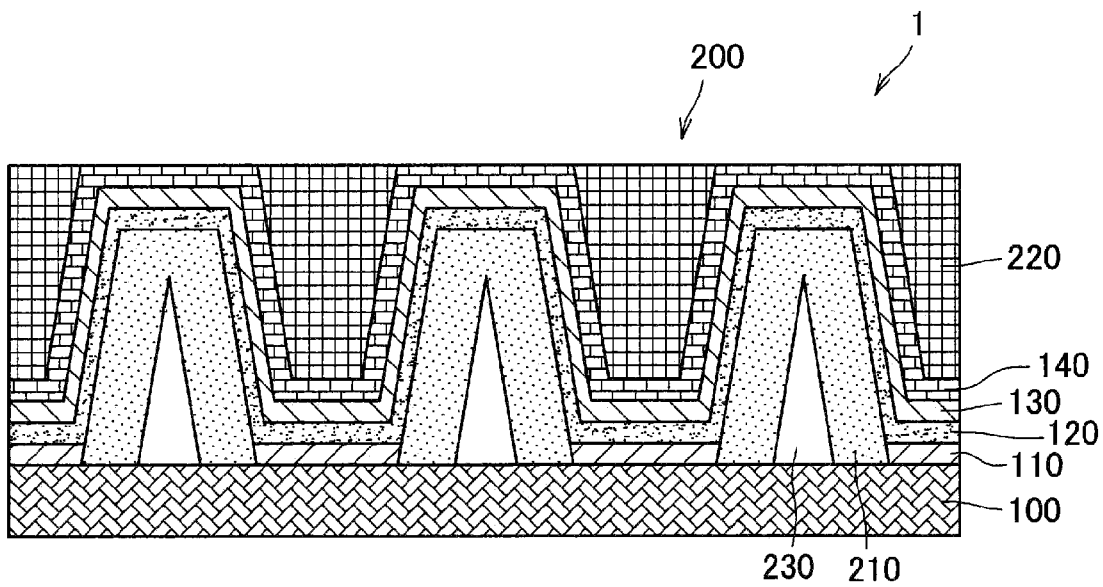
FIG. 13 is a cross-sectional view illustrating a step of a method for producing a light emitting element according to the embodiment.

Subsequently, as illustrated in FIG. 13, a second member 220 is deposited on the protective layer 140 by using a spin coating method or the like such that the recess structure 200 is embedded in the second member 220. In addition, the second member 220 may be formed such that the recess structure 200 is embedded in the second member 220 as follows: after the second member 220 is formed over the entire surface of the protective layer 140, the second member 220 deposited in areas other than the inside of the recess structure 200 is removed by using a photolithography method. The second member 220 may be made of, for example, an acrylic resin in which a filler including $TiO_2$ or $ZrO_2$ is dispersed.

The light-emitting element 1 according to this embodiment can be produced through the above-described steps. Here, the foregoing method for producing the light emitting element 1 is illustrative only, and the method for producing the light emitting element 1 according to this embodiment is not limited to the above-described method. The apparatuses and the conditions used in the production but not described above may be known apparatuses and known conditions.

2. SECOND EMBODIMENT (2.1. Structure of Light Emitting Element)

Figure 14:
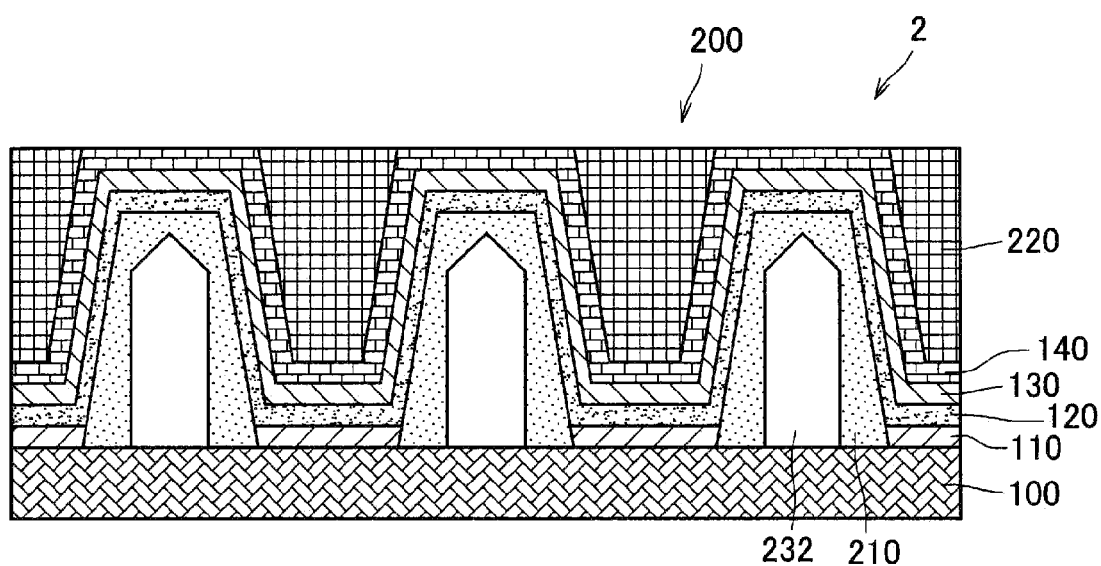
FIG. 14 is a cross-sectional view of a light emitting element according to a second embodiment of the present disclosure cut in the stacking direction.

Next, referring to FIG. 14, the structure of a light emitting element 2 according to a second embodiment of the present disclosure will be described. FIG. 14 is a cross-sectional view of the light emitting element 2 according to this embodiment cut in the stacking direction.

As illustrated in FIG. 14, the light emitting element 2 according to the second embodiment differs from the light emitting element 1 according to the first embodiment in that the cross section of a void 232 when each first member 210 is cut in the thickness direction has a substantially pentagonal shape. The elements other than the void 232 are as described with reference to FIG. 1, and the description thereof is omitted here.

The void 232 having a cross section with a substantially pentagonal shape can be formed, for example, as follows: after each first member 210 is deposited, an opening is formed in each first member 210 by using etching or the like, and then each first member 210 is further deposited so as to cover the opening.

In the light emitting element 2 according to the second embodiment, the void 232 can be formed so as to have a large height in each first member. Thus, the light reflection part including the first member 210 and the void 232 enables reflection of a large amount of light. Therefore, in the light emitting element 2 according to the second modification, the light emitted from the organic light emitting diode can be collected on the opening side of the recess structure 200, whereby light extraction efficiency can be improved.

In addition, in the light emitting element 2 according to the second embodiment, the void 232 can be formed to have a large width in each first member, which makes it possible to further reduce the parasitic capacitance generated between the lower electrodes 110 in adjacent pixels. Furthermore, the void 232 formed to have a large width can further prevent or reduce generation of leakage current between the lower electrodes 110 in adjacent pixels.

Therefore, in the light emitting element 2 according to the second embodiment, the effects of the void 232 in improving the light extraction efficiency and in reducing power consumption can be enhanced by forming the void 232 having a desired shape inside each first member 210 by using etching or the like.

(2.2. Method for Producing Light Emitting Element)

Next, referring to FIG. 15 to FIG. 20, a method for producing the light emitting element 2 according to this embodiment will be described. FIG. 15 to FIG. 20 are cross-sectional views illustrating the steps of the method for producing the light emitting element 2 according to this embodiment.

Figure 15:
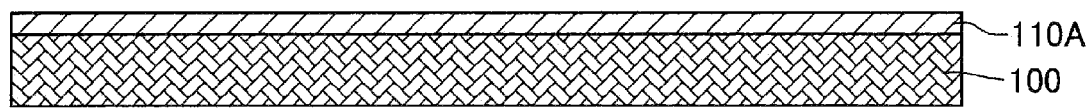
FIG. 15 is a cross-sectional view illustrating a step of a method for producing a light emitting element according to the embodiment.

First, as illustrated in FIG. 15, a metal layer 110A is deposited on a support layer 100 by a sputtering method or the like. The support layer 100 may be a substrate made of glass, semiconductor, or resin, or may be an interlayer insulating film made of an inorganic insulating material, such as $SiO_x$, $SiN_x$, or SiON and disposed on a driver circuit or the like. In addition, the metal layer 110A may be made of, for example, an AlCu alloy.

Figure 16:
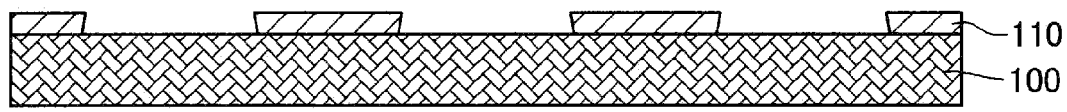
FIG. 16 is a cross-sectional view illustrating a step of a method for producing a light emitting element according to the embodiment.

Next, as illustrated in FIG. 16, the metal layer 110A is patterned by a photolithography method or the like to form lower electrodes 110.

Figure 17:
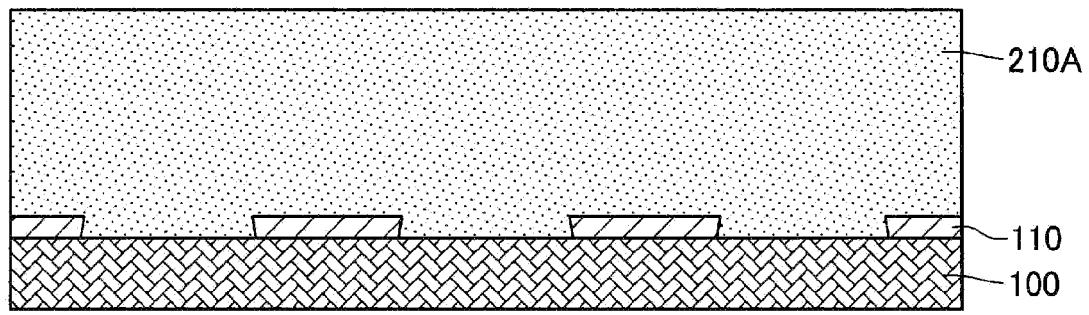
FIG. 17 is a cross-sectional view illustrating a step of a method for producing a light emitting element according to the embodiment.

Subsequently, as illustrated in FIG. 17, a first member layer 210A is deposited on the metal layer 110A by a CVD method or the like. The first member layer 210A may be made of, for example, an inorganic insulating material, such as $SiO_x$.

Figure 18:
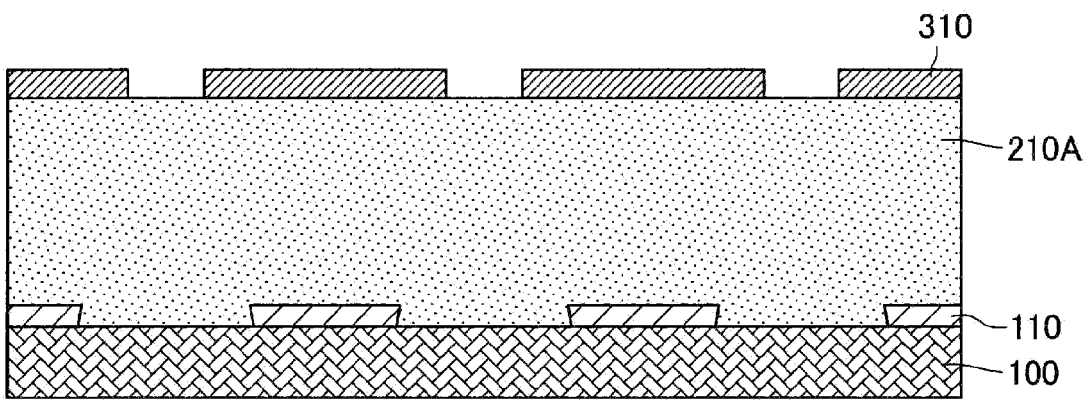
FIG. 18 is a cross-sectional view illustrating a step of a method for producing a light emitting element according to the embodiment.

Next, as illustrated in FIG. 18, a patterned mask layer 310 is deposited on the first member layer 210A by a sputtering method or the like. In the case where the first member layer 210A is made of $SiO_x$, the mask layer 310 may be made of, for example, $AlO_x$ or the like.

Figure 19:
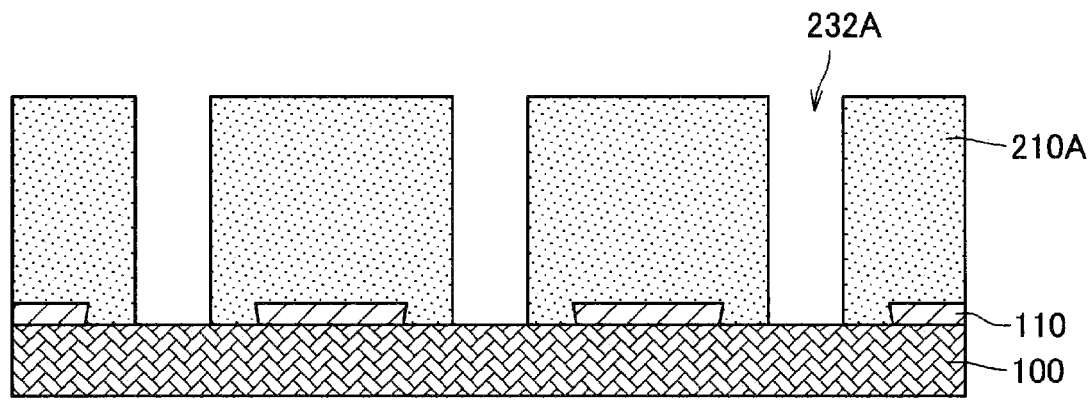
FIG. 19 is a cross-sectional view illustrating a step of a method for producing a light emitting element according to the embodiment.

Subsequently, as illustrated in FIG. 19, openings 232A are formed in the first member layer 210A by performing etching using the mask layer 310. In the case where each first member 210 is made of $SiO_x$, the openings 232A can be formed in the first member layer 210A by, for example, performing dry etching using a fluorocarbon gas.

Figure 20:
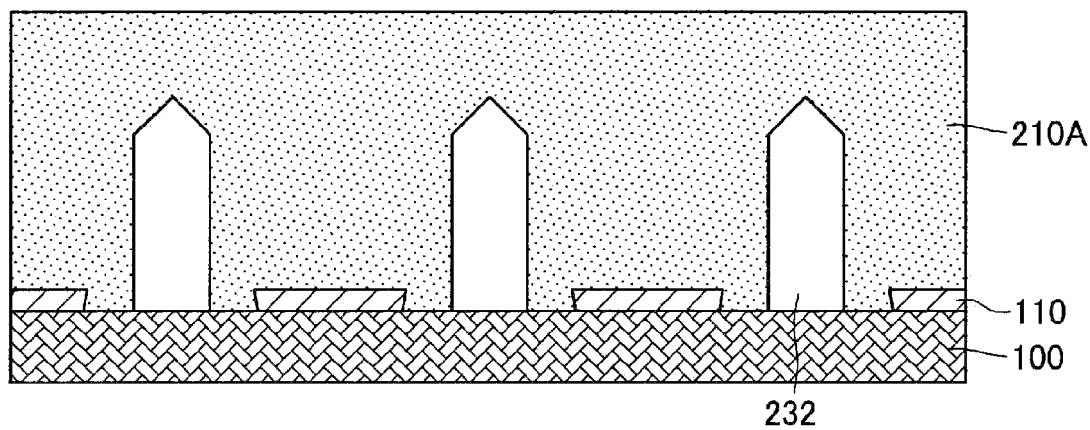
FIG. 20 is a cross-sectional view illustrating a step of a method for producing a light emitting element according to the embodiment.

Next, as illustrated in FIG. 20, the first member layer 210A is further deposited by using CVD or the like so as to cover the openings 232A formed in the first member layer 210A. At this time, the first member layer 210A is isotropically deposited by using a CVD method in a low-vacuum chamber, so that the top of the openings 232A is sealed with the first member layer 210A to form voids 232.

The mechanism for this is that, in an isotropic CVD method with a low-vacuum chamber as described above, a source gas of CVD is unlikely to travel into a region of the film deposition surface on which the recess structure is to be formed, which results in a lower rate of deposition at the bottom of the recess structure. Therefore, the use of an isotropic CVD method with a low-vacuum chamber can form voids 232, with the openings 232A remaining unfilled.

Note that the steps after the step in FIG. 20 are as described with reference to FIG. 8 to FIG. 13, and the description thereof is omitted here.

3. THIRD EMBODIMENT (3.1. Structure of Light Emitting Element)

Figure 21:
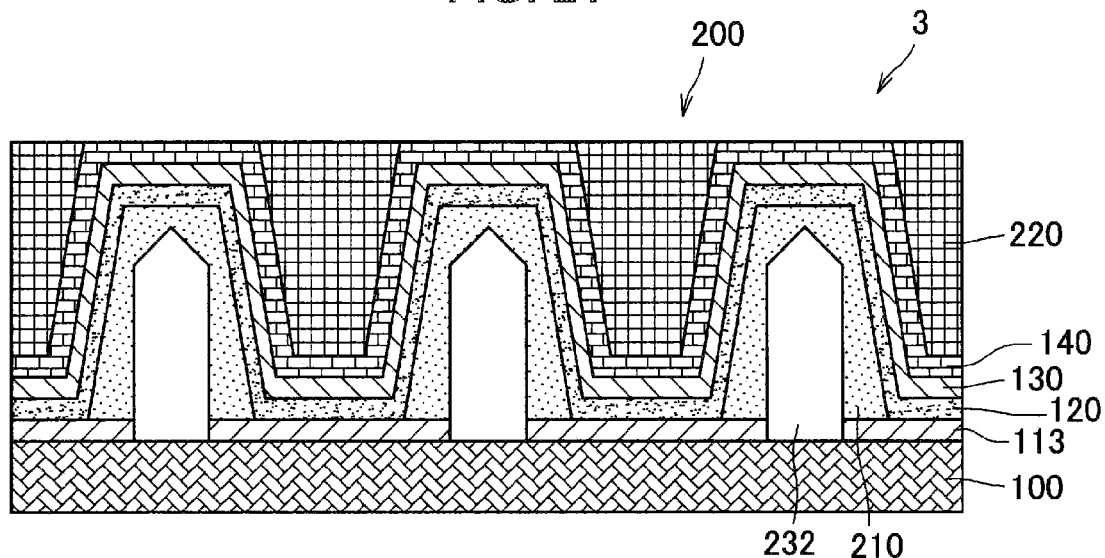
FIG. 21 is a cross-sectional view of a light emitting element according to a third embodiment of the present disclosure cut in the stacking direction.

Next, referring to FIG. 21, the structure of a light emitting element 3 according to a third embodiment of the present disclosure will be described. FIG. 21 is a cross-sectional view of the light emitting element 3 according to this embodiment cut in the stacking direction.

As illustrated in FIG. 21, the light emitting element 3 according to the third embodiment differs from the light emitting element 2 according to the second embodiment only in the regions in which lower electrodes 113 are formed. Specifically, each lower electrode 113 extends from the bottom surface of a recess structure 200 to voids 232. Note that the elements other than the lower electrodes 113 are as described with reference to FIG. 1 and FIG. 14, and the description thereof is omitted here.

The light emitting element 3 according to the third embodiment can be produced more simply and efficiently by performing patterning for forming the lower electrodes 113 and patterning for forming the voids 232 at the same time.

(3.2. Method for Producing Light Emitting Element)

Next, referring to FIG. 22 to FIG. 26, a method for producing the light emitting element 3 according to this embodiment will be described. FIG. 22 to FIG. 26 are cross-sectional views illustrating the steps of the method for producing the light emitting element 3 according to this embodiment.

Figure 22:
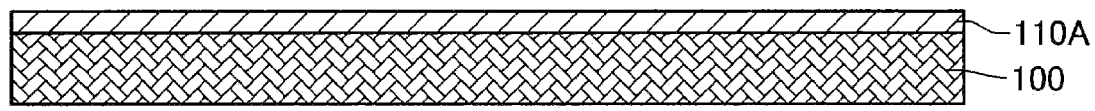
FIG. 22 is a cross-sectional view illustrating a step of a method for producing a light emitting element according to the embodiment.

First, as illustrated in FIG. 22, a metal layer 110A is deposited on a support layer 100 by a sputtering method or the like. The support layer 100 may be a substrate made of glass, semiconductor, or resin, or may be an interlayer insulating film made of an inorganic insulating material, such as $SiO_x$, $SiN_x$, or SiON and disposed on a driver circuit or the like. In addition, the metal layer 110A may be made of, for example, an AlCu alloy.

Figure 23:
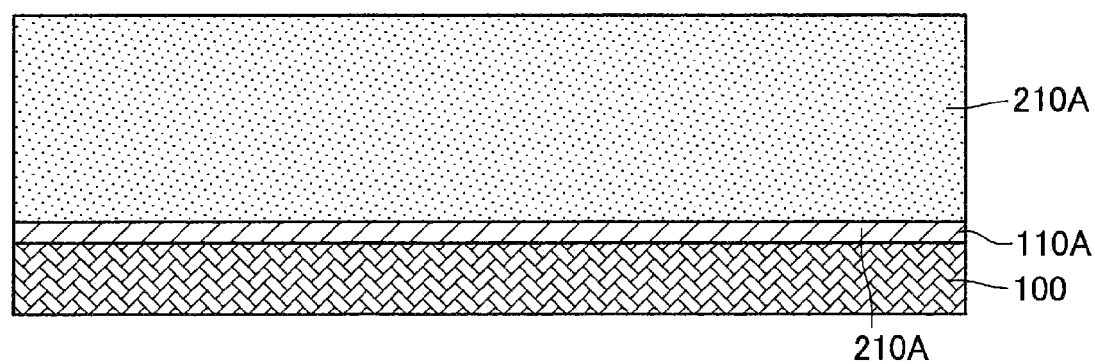
FIG. 23 is a cross-sectional view illustrating a step of a method for producing a light emitting element according to the embodiment.

Next, as illustrated in FIG. 23, a first member layer 210A is deposited on the metal layer 110A by a CVD method or the like. The first member layer 210A may be made of, for example, an inorganic insulating material, such as $SiO_x$.

Figure 24:
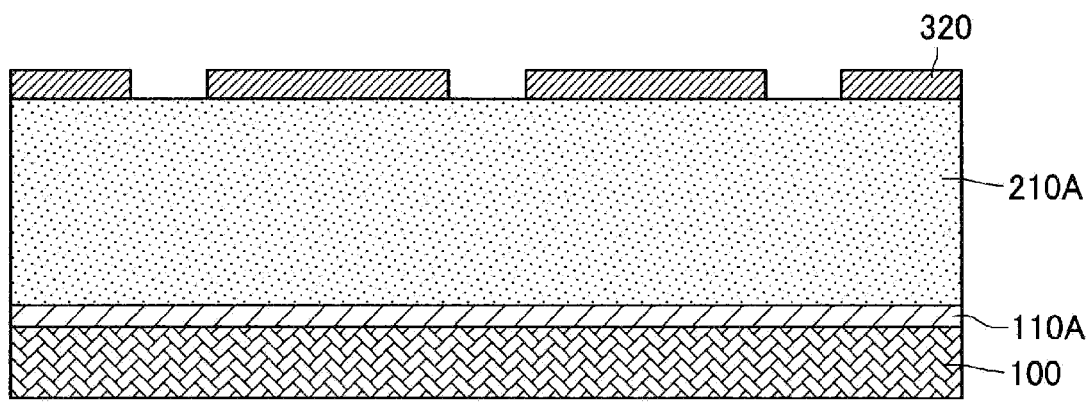
FIG. 24 is a cross-sectional view illustrating a step of a method for producing a light emitting element according to the embodiment.

Subsequently, as illustrated in FIG. 24, a patterned mask layer 320 is deposited on the first member layer 210A by a sputtering method or the like. In the case where the first member layer 210A is made of $SiO_x$, the mask layer 320 may be made of, for example, $AlO_x$ or the like.

Figure 25:
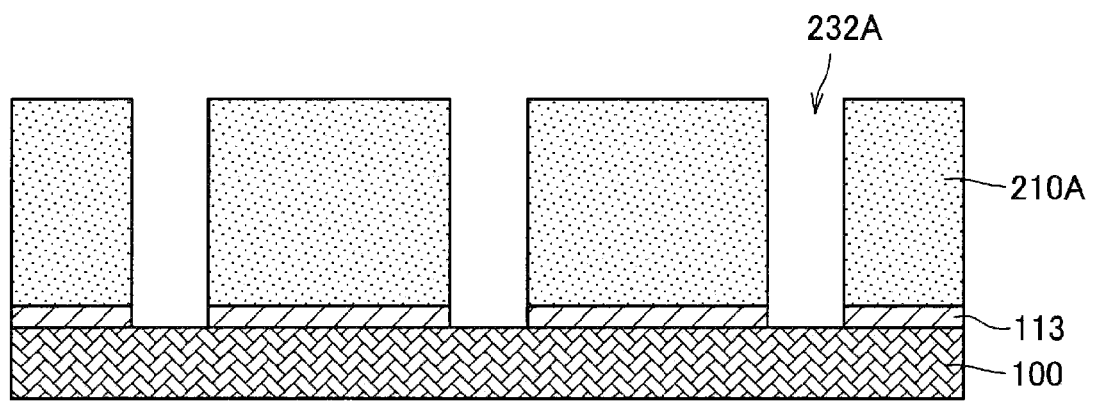
FIG. 25 is a cross-sectional view illustrating a step of a method for producing a light emitting element according to the embodiment.

Subsequently, as illustrated in FIG. 25, by performing etching using the mask layer 320, openings 232A are formed in the first member layer 210A and, at the same time, the metal layer 110A is patterned to form the lower electrodes 113. In the case where each first member 210 is made of $SiO_x$, for example, the openings 232A can be formed in the first member layer 210A by, for example, performing dry etching using a fluorocarbon gas. In addition, the metal layer 110A can be patterned by performing dry etching using a halogen gas, such as chlorine. These etching processes may be carried out at the same time or may be carried out stepwise by changing the etching gas.

Figure 26:
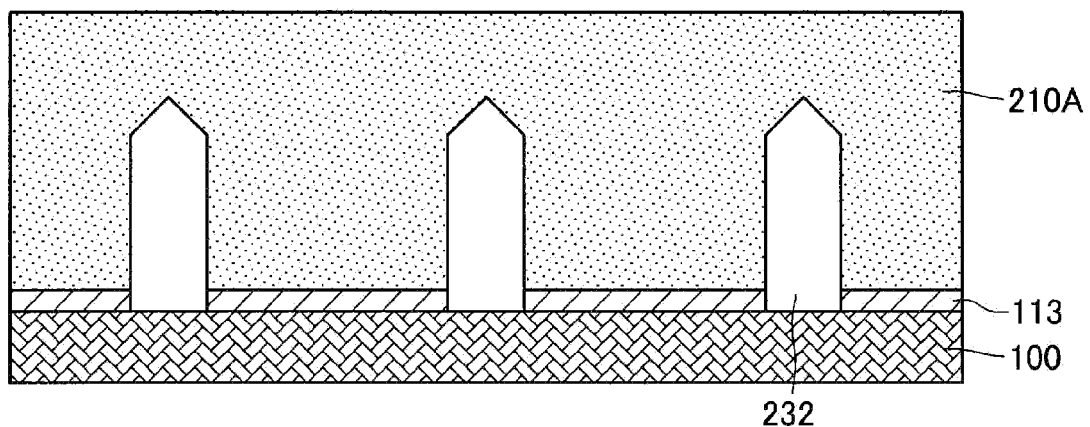
FIG. 26 is a cross-sectional view illustrating a step of a method for producing a light emitting element according to the embodiment.

Next, as illustrated in FIG. 26, the first member layer 210A is further deposited by using CVD or the like so as to cover the openings 232A formed in the first member layer 210A. At this time, the first member layer 210A is isotropically deposited by using a CVD method in a low-vacuum chamber, so that the top of the openings 232A can be sealed with the first member layer 210A to form voids 232, with the openings 232A remaining unfilled.

Note that the steps after the step in FIG. 26 are as described with reference to FIG. 8 to FIG. 13, and the description thereof is omitted here.

4. FOURTH EMBODIMENT (4.1. Structure of Light Emitting Element)

Figure 27:
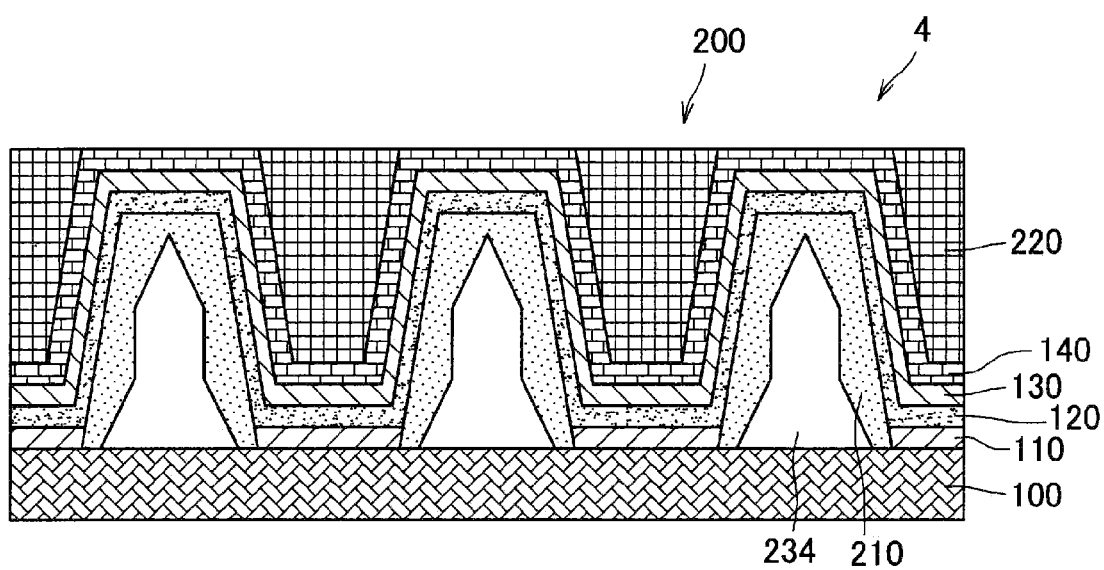
FIG. 27 is a cross-sectional view of a light emitting element according to a fourth embodiment of the present disclosure cut in the stacking direction.

Next, referring to FIG. 27, the structure of a light emitting element 4 according to a fourth embodiment of the present disclosure will be described. FIG. 27 is a cross-sectional view of the light emitting element 4 according to this embodiment cut in the stacking direction.

As illustrated in FIG. 27, the light emitting element 4 according to the fourth embodiment differs from the light emitting element 1 according to the first embodiment in that the cross section of a void 234 when each first member 210 is cut in the thickness direction has a concave polygon shape. The elements other than the void 234 are as described with reference to FIG. 1, and the description thereof is omitted here.

Specifically, the concave polygon shape is a polygonal shape with at least one interior angle greater than 180°. Therefore, at least one diagonal of the concave polygon shape lies outside the concave polygon shape.

The void 234 having a cross section with a concave polygon shape can be formed by the following method. For example, first, during deposition of the first members 210, part of each void 234 is formed at the same time through the use of a difference in rate of deposition. Thereafter, an opening is formed in each first member 210 by using etching or the like so as to communicate with the part of the void 234. The first member 210 is further formed so as to cover the opening, whereby the void 234 having a cross section with a concave polygon shape can be formed.

In the light emitting element 4 according to the fourth embodiment, as in the light emitting element 2 according to the second embodiment, the void 234 can be formed so as to have a large height in each first member. Thus, the first member 210 and the void 234 enable reflection of a large amount of light. In addition, in the light emitting element 4 according to the fourth embodiment, the cross section of the void 234 has a shape similar to a tapered shape that widens toward the support layer 100, compared with the light emitting element 2 according to the second embodiment. This shape further improves light extraction efficiency.

In addition, in the light emitting element 4 according to the fourth embodiment, the void 234 can be formed to have a large width in each first member, which makes it possible to further reduce the parasitic capacitance generated between the lower electrodes 110 in adjacent pixels and further prevent or reduce generation of leakage current.

(4.2. Method for Producing Light Emitting Element)

Next, referring to FIG. 28 to FIG. 33, a method for producing the light emitting element 4 according to this embodiment will be described. FIG. 28 to FIG. 33 are cross-sectional views illustrating the steps of the method for producing the light emitting element 4 according to this embodiment.

Figure 28:
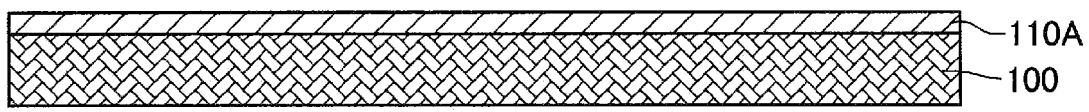
FIG. 28 is a cross-sectional view illustrating a step of a method for producing a light emitting element according to the embodiment.

First, as illustrated in FIG. 28, a metal layer 110A is deposited on a support layer 100 by a sputtering method or the like. The support layer 100 may be a substrate made of glass, semiconductor, or resin, or may be an interlayer insulating film made of an inorganic insulating material, such as $SiO_x$, $SiN_x$, or SiON and disposed on a driver circuit or the like. In addition, the metal layer 110A may be made of, for example, an AlCu alloy.

Figure 29:
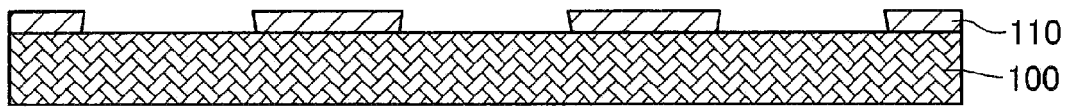
FIG. 29 is a cross-sectional view illustrating a step of a method for producing a light emitting element according to the embodiment.

Next, as illustrated in FIG. 29, the metal layer 110A is patterned by a photolithography method or the like to form lower electrodes 110.

Figure 30:
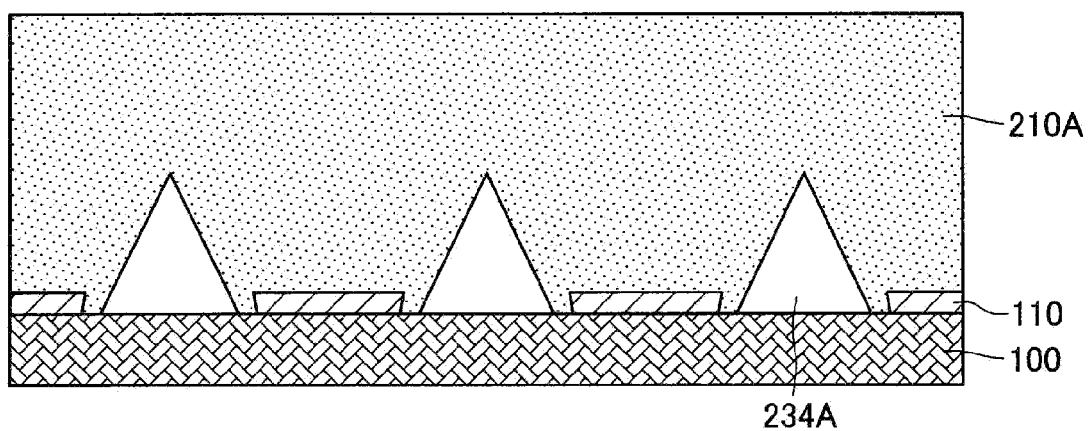
FIG. 30 is a cross-sectional view illustrating a step of a method for producing a light emitting element according to the embodiment.

Subsequently, as illustrated in FIG. 30, a first member layer 210A is deposited on the metal layer 110A by using a CVD method or the like. The first member layer 210A may be made of, for example, an inorganic insulating material, such as $SiO_x$. In addition, the first member layer 210A is isotropically deposited at this time by using a CVD method in a low-vacuum chamber. This process forms part of each void 234A between the lower electrodes 110.

Figure 31:
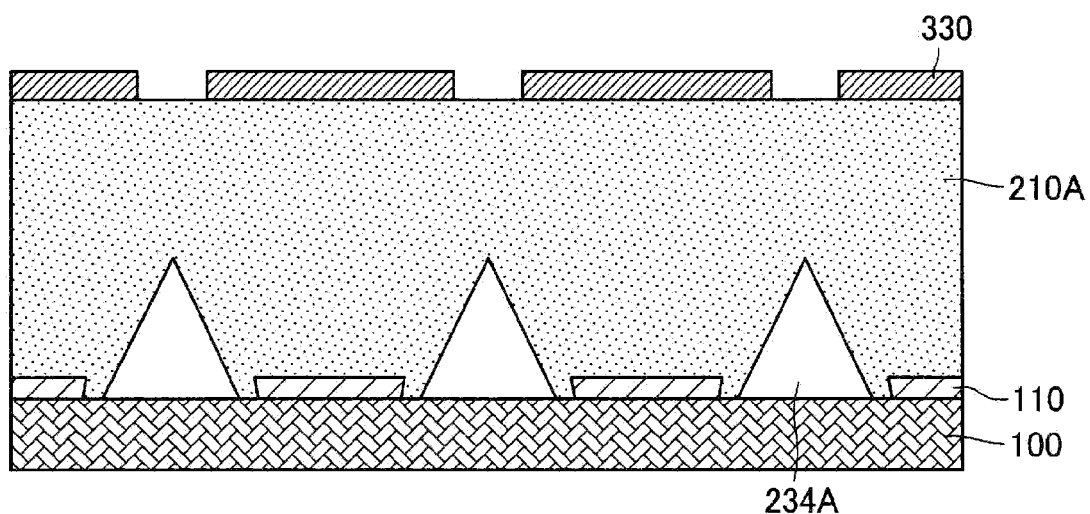
FIG. 31 is a cross-sectional view illustrating a step of a method for producing a light emitting element according to the embodiment.

Next, as illustrated in FIG. 31, a patterned mask layer 330 is deposited on the first member layer 210A by a sputtering method or the like. In the case where the first member layer 210A is made of $SiO_x$, the mask layer 330 may be made of, for example, $AlO_x$ or the like.

Figure 32:
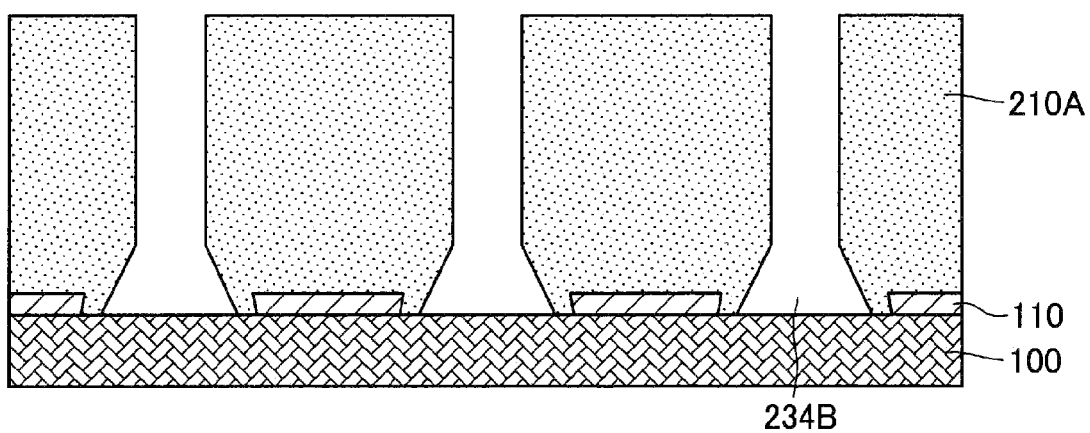
FIG. 32 is a cross-sectional view illustrating a step of a method for producing a light emitting element according to the embodiment.

Subsequently, as illustrated in FIG. 32, openings 234B are formed in the first member layer 210A at the positions corresponding to the voids 234A by performing etching using the mask layer 330. In the case where each first member 210 is made of $SiO_x$, the openings 234B can be formed in the first member layer 210A by, for example, performing dry etching using a fluorocarbon gas.

Figure 33:
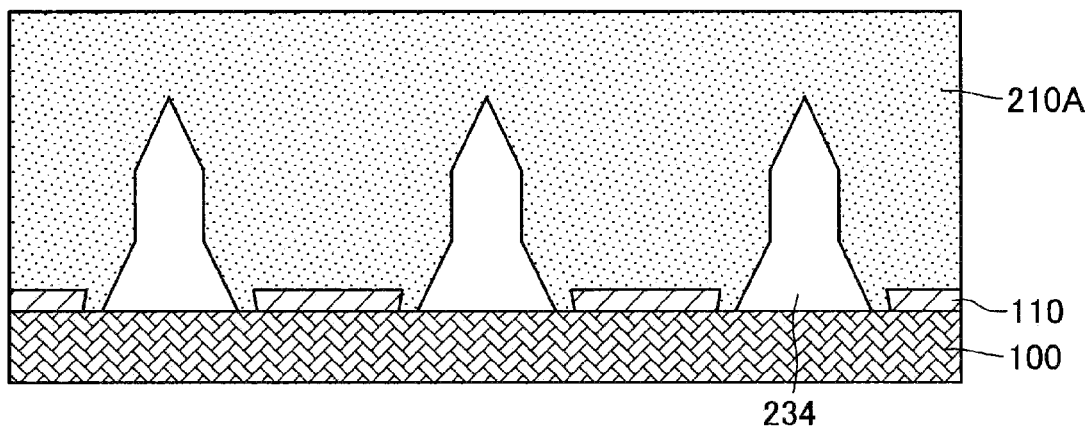
FIG. 33 is a cross-sectional view illustrating a step of a method for producing a light emitting element according to the embodiment.

Next, as illustrated in FIG. 33, the first member layer 210A is further deposited by using CVD or the like so as to cover the openings 234B formed in the first member layer 210A. At this time, the first member layer 210A is isotropically deposited by using a CVD method in a low-vacuum chamber, so that the top of the openings 234B is sealed with the first member layer 210A to form voids 234.

The mechanism for this is that, in an isotropic CVD method with a low-vacuum chamber as described above, the source gas of CVD is unlikely to travel into a region of the film deposition surface on which the recess structure is to be formed, which results in a lower rate of deposition at the bottom of the recess structure. Therefore, the use of an isotropic CVD method with a low-vacuum chamber can form the voids 234, with the openings 234B remaining unfilled.

Note that the steps after the step in FIG. 33 are as described with reference to FIG. 8 to FIG. 13, and the description thereof is omitted here.

5. FIFTH EMBODIMENT (5.1. Structure of Light Emitting Element)

Figure 34:
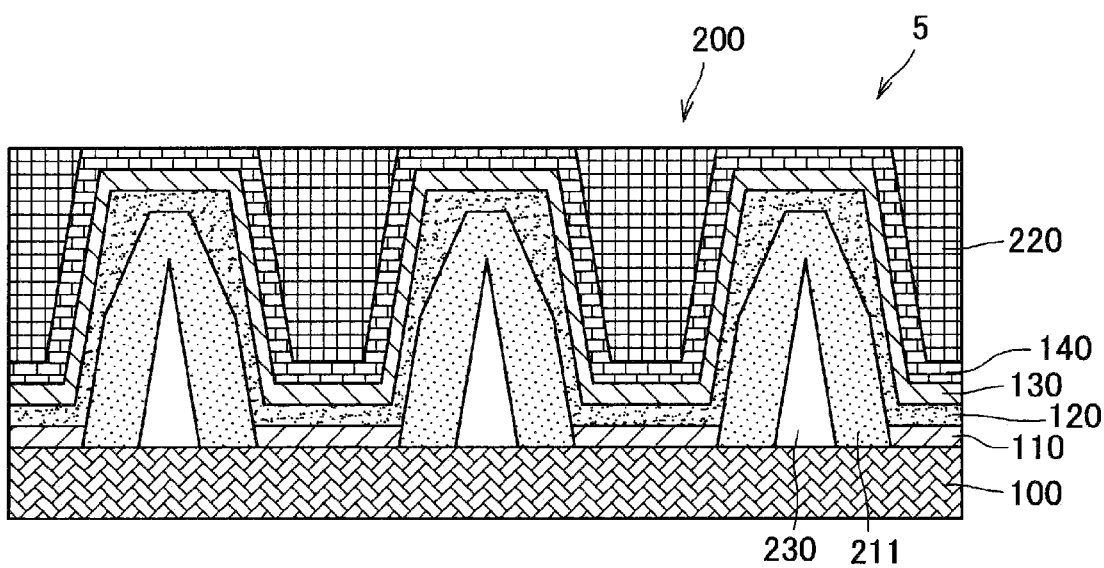
FIG. 34 is a cross-sectional view of a light emitting element according to a fifth embodiment of the present disclosure cut in the stacking direction.

Next, referring to FIG. 34, the structure of a light emitting element 5 according to a fifth embodiment of the present disclosure will be described. FIG. 34 is a cross-sectional view of the light emitting element 5 according to this embodiment cut in the stacking direction.

As illustrated in FIG. 34, the light emitting element 5 according to the fifth embodiment differs from the light emitting element 1 according to the first embodiment in that the inclination of the side walls of each first member 211 changes stepwise. Specifically, the side walls of each first member 211 on the support layer 100 side are inclined more steeply than the side walls of each first member 211 on the top end side. Note that the elements other than the first member 211 are as described with reference to FIG. 1, and the description thereof is omitted here.

The first member 211 in which the angle of inclination of the sidewalls changes stepwise in this manner can be formed by, for example, performing etching stepwise under multiple conditions with different anisotropies. Note that the number of changes in the angle of inclination is at least one, and the maximum number is not limited.

In the light emitting element 5 according to the fifth embodiment, each first member 211 is formed in a small region on the support layer 100, and each lower electrode 110 is thus formed in a large region, compared with the light emitting element 1 according to the first embodiment. Therefore, the area of the regions involved in light emission is large in the light emitting element 5 according to the fifth embodiment, which can realize higher brightness.

Note that, since the side walls of each first member 211 on the support layer 100 side are inclined steeply in the light emitting element 5 according to the fifth embodiment, there is a possibility of low efficiency of the light reflection part including the first member 211 and the second member 220 in collecting light on the opening side of the recess structure 200. However, in the light emitting element 5, the reflection by the light reflection part including the first member 211 and the void 230 covers the light collection on the opening side of the recess structure 200. Overall, the efficiency of extraction of light from the organic light emitting diode can be maintained.

(5.2. Method for Producing Light Emitting Element)

Next, referring to FIG. 35 to FIG. 40, a method for producing the light emitting element 5 according to this embodiment will be described. FIG. 35 to FIG. 40 are cross-sectional views illustrating the steps of the method for producing the light emitting element 5 according to this embodiment.

Figure 35:
FIG. 35 is a cross-sectional view illustrating a step of a method for producing a light emitting element according to the embodiment.

First, as illustrated in FIG. 35, a metal layer 110A is deposited on a support layer 100 by a sputtering method or the like. The support layer 100 may be a substrate made of glass, semiconductor, or resin, or may be an interlayer insulating film made of an inorganic insulating material, such as $SiO_x$, $SiN_x$, or SiON and disposed on a driver circuit or the like. In addition, the metal layer 110A may be made of, for example, an AlCu alloy.

Figure 36:
FIG. 36 is a cross-sectional view illustrating a step of a method for producing a light emitting element according to the embodiment.

Next, as illustrated in FIG. 36, the metal layer 110A is patterned by a photolithography method or the like to form lower electrodes 110.

Figure 37:
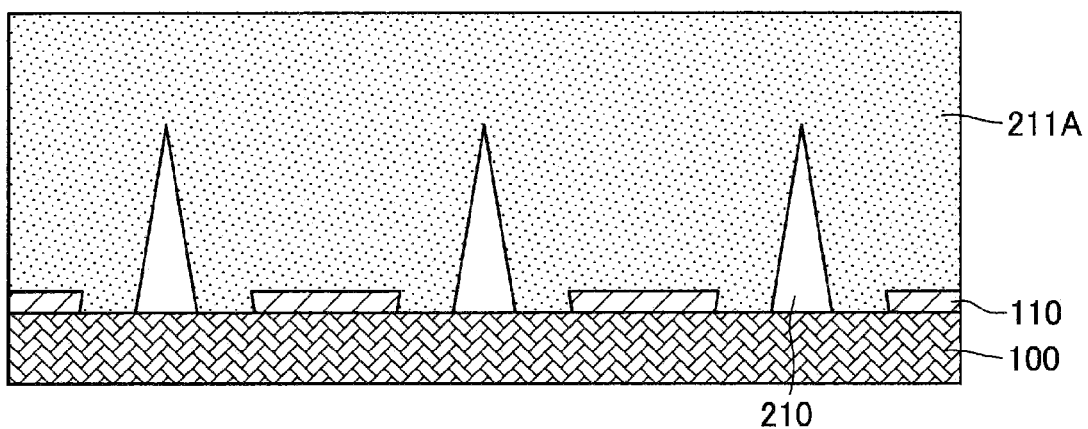
FIG. 37 is a cross-sectional view illustrating a step of a method for producing a light emitting element according to the embodiment.

Subsequently, as illustrated in FIG. 37, a first member layer 211A is deposited on the metal layer 110A by a CVD method or the like. The first member layer 211A may be made of, for example, an inorganic insulating material, such as $SiO_x$. In addition, the first member layer 211A is deposited isotropically at this time by using a CVD method in a low-vacuum chamber. This process forms voids 230 between the lower electrodes 110.

Figure 38:
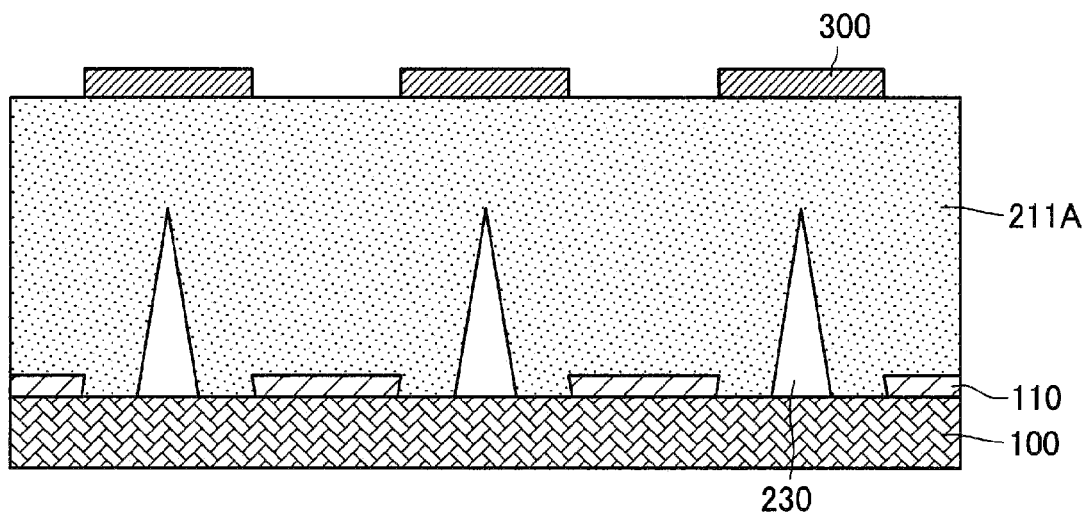
FIG. 38 is a cross-sectional view illustrating a step of a method for producing a light emitting element according to the embodiment.

Next, as illustrated in FIG. 38, a patterned resist 300 is formed on the first member layer 211A by using a photolithography method or the like. The resist 300 may be any known resist as long as the etching selectivity ratio between the resist 300 and $SiO_x$ forming the first member layer 211A is high. Moreover, a BARC film may be formed between the resist 300 and the first member layer 211A in order to prevent or reduce halation during photolithography.

Figure 39:
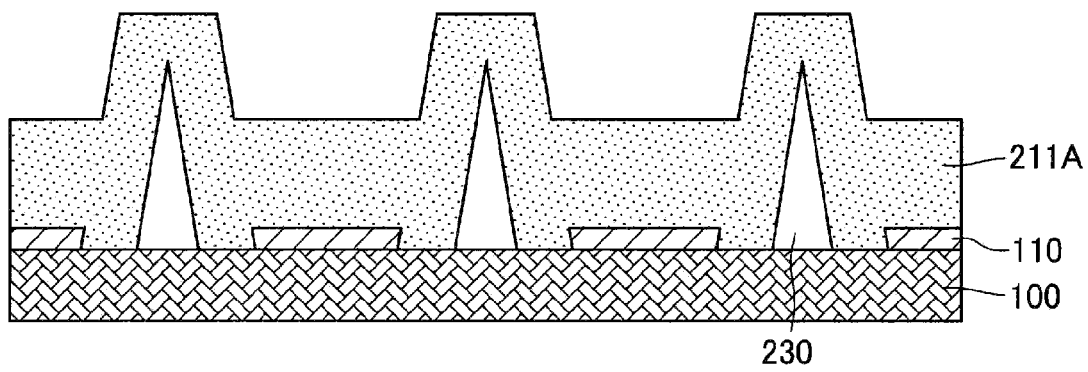
FIG. 39 is a cross-sectional view illustrating a step of a method for producing a light emitting element according to the embodiment.
Figure 40:
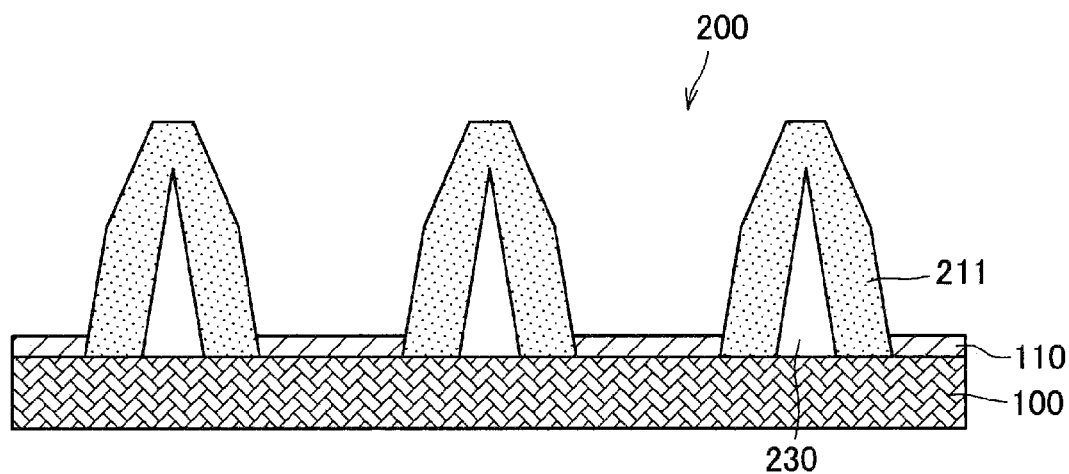
FIG. 40 is a cross-sectional view illustrating a step of a method for producing a light emitting element according to the embodiment.

Subsequently, as illustrated in FIG. 39 and FIG. 40, the lower electrodes 110 are exposed by etching the first member layer 211A stepwise using the patterned resist 300 as a mask, so that first members 211 that form the recess structure 200 are formed. For example, in the case where the first members 210 are made of $SiO_x$, the first members 211 can be formed by using dry etching with a fluorocarbon gas.

Note that the first member layer 211A is etched stepwise under multiple conditions with different anisotropies. This process enables stepwise changes in inclination of the sidewalls of the first members 211. The anisotropy of etching can be controlled by, for example, changing the type or pressure of etching gas used in dry etching.

Note that the steps after the step in FIG. 40 are as described with reference to FIG. 8 to FIG. 13, and the description thereof is omitted here.

6. APPLICATION EXAMPLES

Next, referring to FIG. 41 to FIG. 44, application examples of display elements including the light emitting element according to any one of the embodiments of the present disclosure will be described. FIG. 41 to FIG. 44 are external views illustrating example electronic devices that may include the display element according to an embodiment of the present disclosure.

Figure 41:
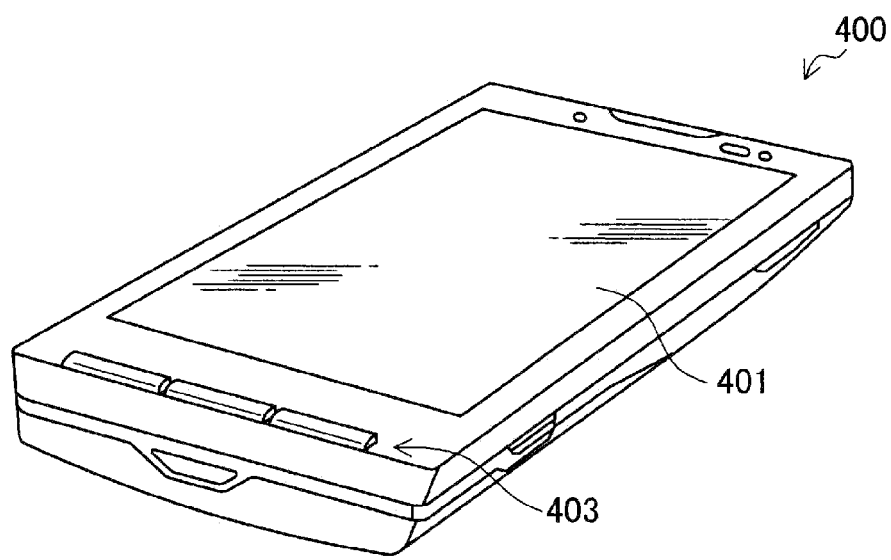
FIG. 41 is an external view illustrating an example of electronic devices that may include a display element according to an embodiment of the present disclosure.

For example, a display element including the light emitting element according to any one of the embodiments of the present disclosure can be used in a display unit of electronic devices, such as smartphones. Specifically, as illustrated in FIG. 41, a smartphone 400 includes a display unit 401 configured to display various types of information, and an operation unit 403 including buttons or the like and configured to receive an operation input from the user. Here, the display unit 401 may include a display element including the light emitting element according to any one of the embodiments of the present disclosure.

Figure 42:
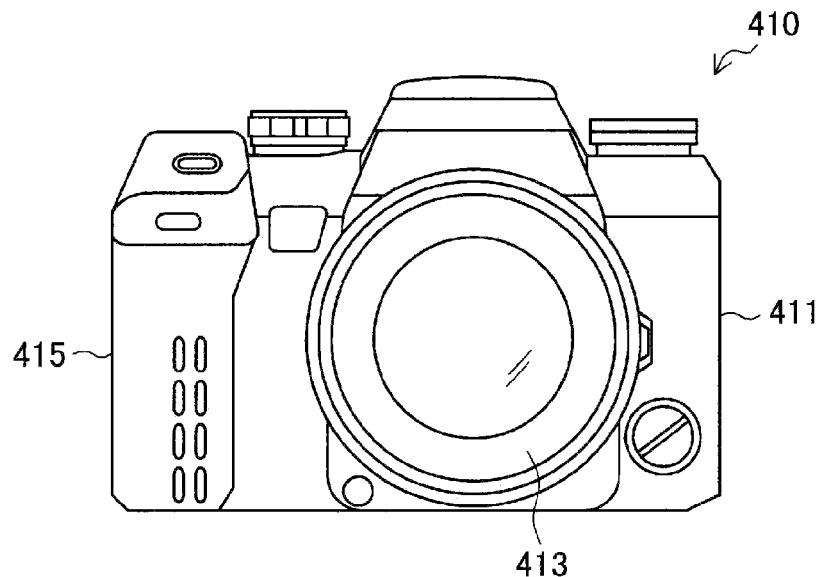
FIG. 42 is an external view illustrating another example of electronic devices that may include a display element according to an embodiment of the present disclosure.
Figure 43:
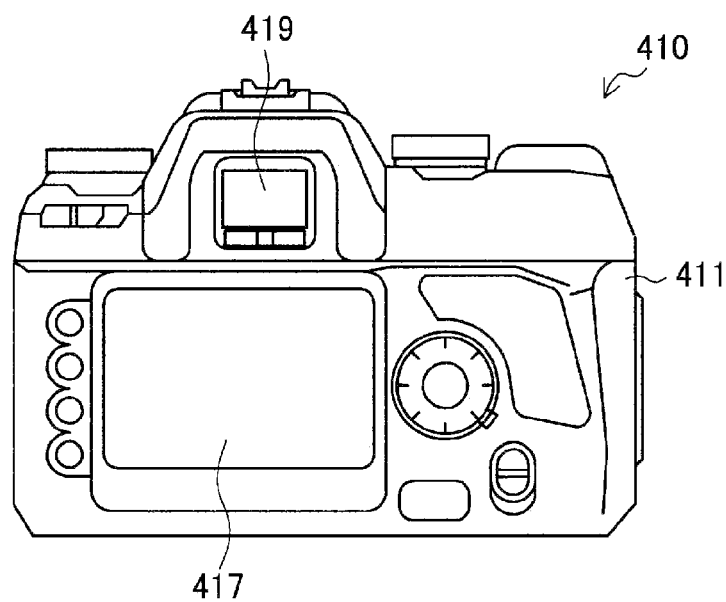
FIG. 43 is an external view illustrating another example of electronic devices that may include a display element according to an embodiment of the present disclosure.

In addition, for example, the display element including the light emitting element according to any one of the embodiments of the present disclosure can be used in a display unit of electronic devices, such as digital cameras. Specifically, as illustrated in FIG. 42 and FIG. 43, a digital camera 410 includes a body (camera body) 411, an exchangeable lens unit 413, a grip 415 to be gripped by the user during shooting, a monitor 417 configured to display various types of information, and an electronic view finder (EVF) 419 configured to display a through-the-lens image to be observed by the user during shooting. Note that FIG. 42 is an external view of the digital camera 410 as viewed from the front (i.e., subject side), and FIG. 43 is an external view of the digital camera 410 as viewed from the back (i.e., photographer side). Here, the monitor 417 and the EVF 419 may include the display element including the light emitting element according to any one of the embodiments.

Figure 44:
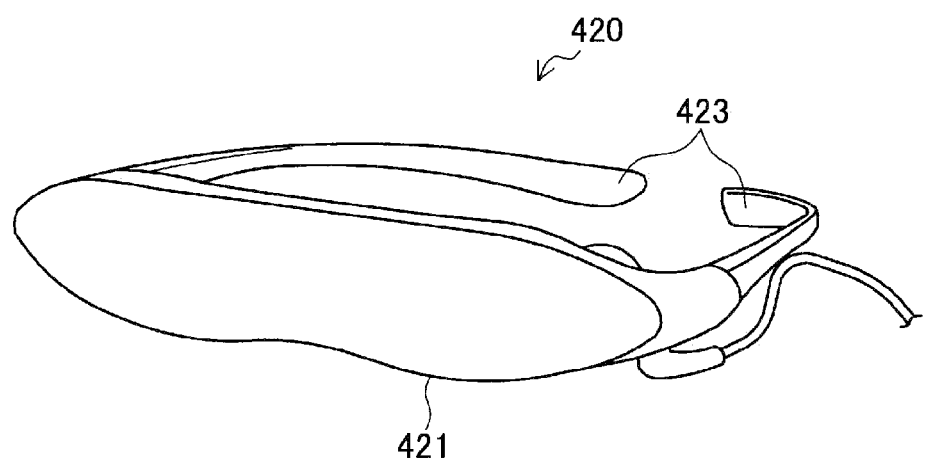
FIG. 44 is an external view illustrating another example of electronic devices that may include a display element according to an embodiment of the present disclosure.

In addition, for example, the display element including the light emitting element according to any one of the embodiments of the present disclosure can be used in a display unit of electronic devices, such as head mounted displays (HMDs). Specifically, as illustrated in FIG. 44, the HMD 420 includes a spectacles-shaped display unit 421 configured to display various types of information, and ear hooks 423 to hook over the user's ears during wearing. Here, the display unit 421 may include the display element including the light emitting element according to any one of the embodiments of the present disclosure.

Note that electronic devices that may include the display element including the light emitting element according to any one of the embodiments of the present disclosure is not limited to the above-described examples. The display element including the light emitting element according to any one of the embodiments of the present disclosure can be used in a display unit of a wide range of electronic devices that perform display on the basis of externally inputted image signals or internally generated image signals. Examples of such electronic devices include television devices, electronic books, personal digital assistants (PDAs), laptop personal computers, video cameras, and game devices.

7. CONCLUSION

As described above, the light emitting element according to any one of the embodiments of the present disclosure enables the light emitted from the organic light emitting diode toward the side walls of the recess structure to be efficiently reflected toward the opening of the recess structure and can thus improve light extraction efficiency.

Also, according to the light emitting element according to any one of the embodiments of the present disclosure, the void formed inside each first member can reduce parasitic capacitance and leakage current while improving the light extraction efficiency, which makes it possible to further reduce power consumption.

Furthermore, it is possible to provide a display element in which a plurality of the light emitting element according to any one of the embodiments of the present disclosure is arranged on a plane. The display element including the light emitting element according to any one of the embodiments of the present disclosure can offer low power consumption as well as high light extraction efficiency.

Note that the fifth embodiment can be carried out in combination with the first to fourth embodiments. It should be understood that combinations thereof are also within the technical scope of the present disclosure.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

In the foregoing description, the display element in which organic light emitting diodes are used as light emitting elements is described as an embodiment of the present disclosure, but the present disclosure is not limited to this example. The display element in the present disclosure is any of display elements that may realize color displays, such as liquid crystal displays, plasma displays, and electronic paper. In these other display elements, the same effect as in the embodiments described above can be obtained as follows: a recess structure having a light emitting element at the bottom is formed by first members having a void inside, and the recess structure is embedded in a second member having a refractive index higher than the first members. Here, the light emitting element refers to a part that emits light toward the outside and lies in each pixel of a display element. For example, the light emitting element in the display element described in the foregoing embodiments corresponds to the organic layer (i.e., organic light emitting diode) sandwiched between the lower electrode and the upper electrode. In addition, the light emitting element in a liquid crystal display corresponds to one pixel of a liquid crystal panel having a backlight. Furthermore, the light emitting element in a plasma display corresponds to one discharge cell of a plasma display panel.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A light emitting element including:

a lower electrode disposed on a support layer;

first members disposed on the support layer so as to surround the lower electrode to form a recess structure, the first members each having a void inside;

an organic layer disposed on the lower electrode and the first members and along the recess structure, the organic layer containing an organic luminescent material;

an upper electrode disposed on the organic layer and along the recess structure; and a second member disposed above the upper electrode such that the recess structure is embedded in the second member, the second member having a higher refractive index than the first members.

(2)

The light emitting element according to (1), in which a cross section of the void when each first member is cut in a thickness direction has a tapered shape that widens toward the support layer.

(3)

The light emitting element according to (2), in which the cross section of the void when each first member is cut in the thickness direction has a substantially triangular shape.

(4)

The light emitting element according to (2), in which the cross section of the void when each first member is cut in the thickness direction has a substantially pentagonal shape.

(5)

The light emitting element according to (2), in which the cross section of the void when each first member is cut in the thickness direction has a concave polygon shape.

(6)

The light emitting element according to any one of (1) to (5), in which the first members each have a tapered shape that widens toward the support layer.

(7)

The light emitting element according to (6), in which a side wall of each first member on the support layer side is inclined more steeply than the side wall of each first member on a top end side of each first member.

(8)

The light emitting element according to any one of (1) to (7), in which the first members each have a refractive index of 1.1 or more and 1.8 or less, and a difference in refractive index between the second member and the first members is 0.2 or more.

(9)

A display element including a plurality of light emitting elements arranged on a plane, each of the light emitting elements including a lower electrode disposed on a support layer, first members disposed on the support layer so as to surround the lower electrode to form a recess structure, the first members each having a void inside, an organic layer disposed on the lower electrode and the first members and along the recess structure, the organic layer containing a luminescent organic compound, an upper electrode disposed on the organic layer and along the recess structure, and a second member disposed above the upper electrode such that the recess structure is embedded in the second member, the second member having a higher refractive index than the first members.

(10)

A method for producing a light emitting element, the method including:

forming a lower electrode on a support layer;

forming first members positioned to surround the lower electrode on the support layer so as to form a recess structure having the lower electrode as a bottom surface, the first members each having a void inside;

forming an organic layer on the lower electrode and the first members and along the recess structure, the organic layer containing an organic luminescent material;

forming an upper electrode on the organic layer and along the recess structure; and forming a second member above the upper electrode such that the recess structure is embedded in the second member, the second member having a higher refractive index than the first members.

(11)

The method for producing a light emitting element according to (10), in which the void is formed by using a difference between a rate of deposition on the lower electrode and a rate of deposition on the support layer in deposition of the first members.

(12)

The method for producing a light emitting element according to (10), in which, after the deposition of the first members, the void is formed by forming an opening in each first member by etching, and further depositing each first member so as to cover the opening.

(13)

The method for producing a light emitting element according to (12), in which the lower electrode is patterned by etching simultaneously with the formation of the opening in each first member.

(14)

The method for producing a light emitting element according to any one of (10) to (13), in which the first members are etched stepwise under a plurality of conditions with different anisotropies during patterning for forming the recess structure having the lower electrode as a bottom surface.

REFERENCE SIGNS LIST 1 light emitting element
100 support layer
110 lower electrode
120 organic layer
130 upper electrode
140 protective layer
200 recess structure
210 first member
220 second member
230 void

The invention claimed is:

1. A light emitting element comprising:
a first member on a support layer, a shape of the first member widens toward the support layer;
a void in the first member, a shape of the void widens toward the support layer; and
lower electrodes on the support layer, the first member is between a first one of the lower electrodes and a second one of the lower electrodes.

2. The light emitting element according to claim 1, wherein the first one of the lower electrodes and the second one of lower electrodes touch the first member.

3. The light emitting element according to claim 1, wherein the lower electrodes touch the support layer.

4. The light emitting element according to claim 1, wherein the first member touches the support layer.

5. The light emitting element according to claim 1, wherein the void extends into the first member from the support layer and terminates inside the first member.

6. The light emitting element according to claim 1, wherein the first member encases the void.

7. The light emitting element according to claim 1, further comprising:
an organic layer on the lower electrode and the first members, the organic layer contains an organic luminescent material.

8. The light emitting element according to claim 7, further comprising:
an upper electrode on the organic layer, the organic layer is between the first member and the upper electrode.

9. The light emitting element according to claim 8, wherein the organic layer is between the lower electrodes and the upper electrode.

10. The light emitting element according to claim 8, further comprising:
second members on the upper electrode, the first member is between a first one of the second members and a second one of the second members.

11. The light emitting element according to claim 10, wherein the organic layer is between the first one of the lower electrodes and the first one of the second members.

12. The light emitting element according to claim 10, wherein the organic layer is between the second one of the lower electrodes and the second one of the second members.

13. The light emitting element according to claim 10, wherein a refractive index of the second member is higher than a refractive index the first members.

14. The light emitting element according to claim 10, further comprising:
a protective layer on the upper electrode, the protective layer is between the upper electrode and the second members.

15. A display element comprising:
a plurality of light emitting elements arranged on a plane, each of the light emitting elements comprise the light emitting element according to claim 1.

16. A method for producing a light emitting element, the method comprising:
patterning a conductive material to form, on a support layer, lower electrodes; and
patterning an insulating material to form, on the support layer, a first member of a shape that widens toward the support layer,
wherein the first member is between a first one of the lower electrodes and a second one of the lower electrodes, and
wherein a void in the first member is of a shape that widens toward the support layer.

17. The method according to claim 16, further comprising:
depositing, before patterning the insulating material, the insulating material onto the support layer and the lower electrodes,
wherein the void is formed, when depositing the insulating material, by a difference between a rate that the insulating material is deposited on the lower electrodes and a rate that the insulating material is deposited on the support layer.

18. The method according to claim 16, wherein the void is formed by:
etching the first member to form an opening in the first member, and thereafter,
depositing the insulating material so as to cover the opening.

19. The method according to claim 18, wherein patterning the conductive material is performed when etching the first member.

20. The method according to claim 19, wherein an anisotropic etch that forms the opening differs from an anisotropic etch that forms the lower electrodes.

* * * * *